(12) United States Patent
Avenas et al.

(10) Patent No.: US 12,464,688 B2
(45) Date of Patent: Nov. 4, 2025

(54) MODULAR POWER ELECTRONICS SYSTEM WITH ELECTRICALLY-CONDUCTIVE HEATSINK POLARIZATION

(71) Applicants: INSTITUT POLYTECHNIQUE DE GRENOBLE, Grenoble (FR); UNIVERSITE GRENOBLE ALPES, Saint Martin d'Heres (FR); CENTRE NATIONAL DE LA RECHERCHE SCIENTIFIQUE, Paris (FR)

(72) Inventors: Yvan Avenas, Montbonnot Saint Martin (FR); Wendpanga Bikinga, Grenoble (FR); Bachir Mezrag, Fontaine (FR)

(73) Assignees: INSTITUT POLYTECHNIQUE DE GRENOBLE, Grenoble (FR); UNIVERSITE GRENOBLE ALPES, Saint Martin d'Heres (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 279 days.

(21) Appl. No.: 18/246,991

(22) PCT Filed: Sep. 23, 2021

(86) PCT No.: PCT/EP2021/076243
§ 371 (c)(1),
(2) Date: Mar. 28, 2023

(87) PCT Pub. No.: WO2022/063921
PCT Pub. Date: Mar. 31, 2022

(65) Prior Publication Data
US 2023/0413495 A1 Dec. 21, 2023

(30) Foreign Application Priority Data
Sep. 28, 2020 (FR) ...................... 2009856

(51) Int. Cl.
H05K 7/20 (2006.01)
H02M 7/00 (2006.01)
H05K 9/00 (2006.01)

(52) U.S. Cl.
CPC ............ H05K 7/209 (2013.01); H02M 7/003 (2013.01); H05K 9/0024 (2013.01)

(58) Field of Classification Search
CPC ..................................................... H02M 7/003
See application file for complete search history.

(56) References Cited

U.S. PATENT DOCUMENTS 5,164,624 A   11/1992  Desai et al.
5,961,203 A * 10/1999  Schuda ................... F21V 29/74
                                                    362/264

(Continued)

FOREIGN PATENT DOCUMENTS

CN    111541392 A   8/2020
FR      3088137 A1  5/2020

OTHER PUBLICATIONS

International Search Report issued in corresponding International Application No. PCT/EP2021/076243, dated Jan. 6, 2022, pp. 1-6.

(Continued)

*Primary Examiner* — Zachary Pape
(74) *Attorney, Agent, or Firm* — HAUPTMAN HAM, LLP

(57) ABSTRACT

A power electronic system including a plurality of power components and a plurality of electrically-conductive heatsinks, each of said power components being disposed between two electrically-conductive heatsinks of the plurality of electrically-conductive heatsinks, at least one electrically-conductive heatsink being configured to be polarised according to a phase potential, called phase heatsink, at least one electrically-conductive heatsink being configured to be polarised according to a +DC potential, called cathode (Continued)

heatsink, and at least one electrically-conductive heatsink configured to be polarised according to a −DC potential, called anode heatsink, the system further includes at least one external phase connection, and at least one external +DC connection, and at least one external −DC connection respectively connected to the phase heatsink, to the cathode heatsink and to the anode heatsink.

32 Claims, 24 Drawing Sheets

(56) References Cited

U.S. PATENT DOCUMENTS

| 10,026,673 | B2* | 7/2018 | Okumura | H01L 23/051 |
| 11,444,543 | B2* | 9/2022 | Riou | H05K 7/209 |
| 2007/0076355 | A1 | 4/2007 | Oohama | |
| 2011/0242761 | A1 | 10/2011 | Tonomoto | |
| 2012/0014059 | A1 | 1/2012 | Zeng et al. | |
| 2019/0088568 | A1 | 3/2019 | Ishino et al. | |
| 2022/0077021 | A1 | 3/2022 | Avenas | |

OTHER PUBLICATIONS

Written Opinion issued in corresponding International Application No. PCT/EP2021/076243, dated Jan. 5, 2022, pp. 1-9.

* cited by examiner

MODULAR POWER ELECTRONICS SYSTEM WITH ELECTRICALLY-CONDUCTIVE HEATSINK POLARIZATION

The present application is a U.S. National Phase of International Application Number PCT/EP2021/076243, filed Sep. 23, 2021, which claims priority to French Application No. 2009856, filed Sep. 28, 2020.

TECHNICAL FIELD

The invention relates to power electronics systems. It finds at least one particularly advantageous application in the field of static power converters.

PRIOR ART

A power electronics system such as a power electronics converter generally comprises elementary power modules connected together.

Each elementary power module comprises power components, such as transistors (for example IGBTs, standing for "Insulated Gate Bipolar Transistor") and diodes, assembled in the form of a chip in order to ensure an elementary function, for example an electronic switch function.

The heat produced by the power components of the elementary power modules must be dissipated. Cooling of these elementary power modules is a major issue for the proper operation of the power electronics system.

The size and the mass of the power electronics system are also an important issue.

One solution consists of interposing the power component between a first electrically-conductive heatsink and a second electrically-conductive heatsink, as disclosed by the patent document FR3088137 A1.

Advantageously, this solution allows functionalising the heatsinks of the power module. Hence, it is possible to assemble several power modules in a compact manner, in the form of a stack of said power modules, in order to make electronic cells comprising at least two power modules interconnected via their heatsinks.

The principle of assembling the modules together disclosed by the patent document FR3088137 A1 allows considering different types of electronic cells, comprising for example power modules in series or in parallel.

However, the external connections of the electronic cells should be adapted to such an assembly of elementary power modules.

An object of the present invention is to provide a power electronics system comprising power modules in parallel and/or in series and optimised external connections.

Another object of the present invention is to provide an optimised power electronics system, allowing in particular reducing the mass and/or the size compared to existing solutions.

Other purposes, characteristics and advantages of this invention will appear upon reading the following description and its accompanying drawings. It is understood that other advantages can be incorporated thereto.

SUMMARY

To achieve this objective, according to one embodiment, a power electronics system is provided comprising a plurality of power components and a plurality of electrically-conductive heatsinks, each of said power components being disposed between two electrically-conductive heatsinks of the plurality of electrically-conductive heatsinks, at least one electrically-conductive heatsink being configured to be polarised according to a phase potential, called phase heatsink, at least one electrically-conductive heatsink being configured to be polarised according to a +DC potential, called cathode heatsink, and at least one electrically-conductive heatsink configured to be polarised according to a −DC potential, called anode heatsink.

Advantageously, the system further comprises at least one external phase connection, and at least one external +DC connection, and at least one external −DC connection respectively connected to the phase heatsink, to the cathode heatsink and to the anode heatsink.

Such an electronic system comprising electronic modules (each formed by a power component disposed between two electrically-conductive heatsinks) connected together according to different configurations and having external +DC, −DC and phase connections, advantageously allows making different structures of the power electronics field, such as switching cells, choppers, or inverters, possibly with multilevel or interleaved configurations.

Advantageously, such a power electronics system may be implemented for on-board applications requiring low mass and/or small size, typically in the (air or land) transport field.

BRIEF DESCRIPTION OF THE FIGURES

The aims, purposes, characteristics and advantages of the invention will be better understood upon reading the detailed description of one embodiment thereof, which is illustrated by means of the following accompanying drawings, in which.

Figure 1:
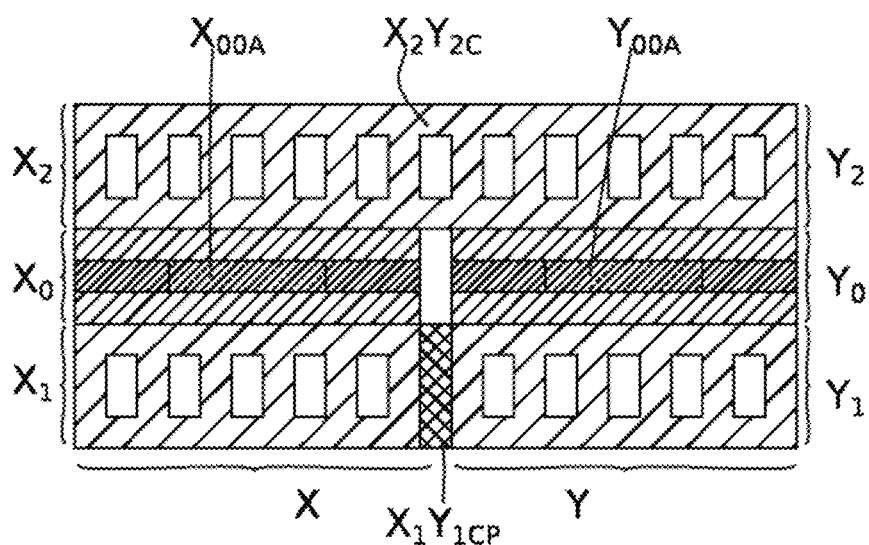
FIG. 1 schematically illustrates a switching cell according to an embodiment of the present invention.

The drawings are provided by way of example and are not intended to limit the scope of the invention. They constitute diagrammatic views intended to ease the understanding of the invention and are not necessarily to the scale of practical applications.

In particular, the thicknesses and dimensions of the different illustrated layers and portions of the printed circuit boards, the heatsinks and the electrical connections are not representative of reality.

In the present patent application, the following notations are used:

For an elementary power electronics module X, we will denote:

X0 the printed circuit board of this module (including a power component), X1, X2 the first and second heatsinks of this module, X00A the power electronics component of this module.

In the present patent application, a conductive electrical connection between a heatsink Xi (i=1, 2) of a first module X and a heatsink Yj (j=1, 2) of a second module Y, is denoted: XiYjC In the present patent application, a capacitive electrical connection between a heatsink Xi (i=1, 2) of a first module X and a heatsink Yj (j=1, 2) of a second module Y, is denoted: XiYjCP In the present patent application, an insulating electrical connection between a heatsink Xi (i=1, 2) of a first module X and a heatsink Yj (j=1, 2) of a second module Y, is denoted: XiYjI An electronic cell is denoted C0$n$ (n=1-4).

All of the references of each elementary power electronics module and/or of each electronic cell are not necessarily indicated in the drawings for clarity.

Nevertheless, the references of the elements not explicitly referenced in the drawings can be easily deduced from the notations explained hereinabove and from the following detailed description.

DETAILED DESCRIPTION

Before starting a detailed review of embodiments of the invention, optional features that may be used in combination or alternatively are set out hereinafter:

According to one example, the power components and the electrically-conductive heatsinks are assembled so as to form elementary switching cells connected in parallel, each elementary switching cell comprising:

A first elementary power electronics module, called first elementary module,

A second elementary power electronics module, called second elementary module, the first elementary module comprising:

an electrically-conductive heatsink configured to be polarised according to a −DC potential, called anode heatsink, and an electrically-conductive heatsink configured to be polarised according to a phase potential, called first phase heatsink, a first power component, preferably integrated on or in a printed circuit board, disposed between the anode heatsink and the first phase heatsink, the second elementary module comprising:

an electrically-conductive heatsink configured to be polarised according to a +DC potential, called cathode heatsink, an electrically-conductive heatsink configured to be polarised according to the phase potential, called second phase heatsink, a second power component, preferably integrated on or in a printed circuit board, disposed between the cathode heatsink and the second phase heatsink.

According to one example, the first and second elementary modules are adjacent according to a lateral connection direction y, and connected together by a conductive lateral electrical connection between the first and second phase heatsinks, and by a capacitive lateral electrical connection between the anode and cathode heatsinks. Thus, a switching cell can be easily formed by connecting the elementary modules together.

According to one example, the anode and cathode heatsinks and the phase heatsinks of the elementary switching cells are configured to let a cooling fluid to pass according to a direction x axial with respect to the lateral connection direction y. This allows efficiently cooling the switching cell, while minimising pressure drops.

According to one example, the elementary switching cells are assembled one behind the other according to the axial direction x, so that the anode heatsinks of said cells are aligned one behind the other according to the axial direction x, and the cathode heatsinks of said cells are aligned one behind the other according to the axial direction x, and that the first phase heatsinks of said cells are aligned one behind the other according to the axial direction x, and that the second phase heatsinks of said cells are aligned one behind each other others according to the axial direction x. This allows simply making an electronic system comprising several switching cells in parallel. This allows simplifying the design of the external connections.

According to one example, the elementary switching cells are assembled one behind the other according to the axial direction x, so that an anode heatsink of a given cell is aligned with a cathode heatsink of an immediately adjacent cell according to the axial direction x, and vice versa, and that the first phase heatsinks of said cells are aligned one behind the other according to the axial direction x, and that the second phase heatsinks of said cells are aligned one behind the other according to the axial direction x. Alternating at least partially the anode and cathode heatsinks allows reducing the parasitic inductance of all switching cells, in particular by creating reverse magnetic fields. The anode and cathode heatsinks are herein not directly in contact with each other. Preferably, they are insulated from each other and disposed so as to ensure holding the voltage of all of the switching cells, in particular with respect to the different electric fields generated by each of the anode and cathode heatsinks.

According to one example, the external phase connection is made on a first side of the cells formed by the first and second phase heatsinks, and the external +DC and −DC connections are made on a second side of the cells formed by the anode and cathode heatsinks, said second side being opposite to the first side according to the axial direction x. This enables a better distribution of the current between the elementary modules.

According to one example, all elementary switching cells are assembled side-by-side according to the lateral connection direction y and/or according to a central connection direction z, so as to reduce pressure drops during flow of the cooling fluid according to the axial direction x. Thus, all of the anode and cathode heatsinks are disposed according to the same plane perpendicular to the flow direction of the cooling fluid. Pressure drops are minimised.

According to one example, the electronic system comprises at least first and second elementary switching cell blocks assembled one behind the other according to the axial direction x, said at least first and second blocks being adjacent and connected according to a central connection direction z so that the first and second phase heatsinks of the first block are connected to the first and second phase heatsinks of the second block.

According to one example, the external +DC and −DC connections respectively comprise +DC and −DC connectors configured to respectively connect the cathode heatsinks of the second block with the cathode heatsinks of the first block, and the anode heatsinks of the second block with the anode heatsinks of the first block.

According to one example, the electronic system comprises at least first and second elementary switching cell blocks assembled one behind the other according to the axial direction x, said at least first and second blocks being adjacent and separated according to the lateral connection direction y by a separation space. Thus, the cooling fluid flowing according to the direction x passes through fewer consecutive heatsinks. Thus, pressure drops are reduced.

According to one example, the separation space comprises at least one control board configured to control the power components of the elementary switching cells of each of the first and second blocks, and a draughtproofing configured to block a passage of the cooling fluid. The draughtproofing allows electrically insulating the cathode heatsinks of the first block from the anode heatsinks of the second block (or vice versa). The draughtproofing also allows forcing the circulation of the cooling fluid in the heatsinks. Thus, the cooling efficiency is improved.

According to one example, the cathode heatsinks of the first and second blocks border the separation space. This allows connecting all cathode heatsinks on the one hand, and all anode heatsinks on the other more easily. This also allows adding an electromagnetic compatibility shield opposite the phase heatsinks and/or opposite the cathode heatsinks and/or opposite the anode heatsinks more easily. This shield may also be connected to the cathode heatsinks or to the anode heatsinks.

According to one example, the anode heatsinks of the first and second blocks border the separation space. This allows connecting all cathode heatsinks on the one hand, and all anode heatsinks on the other more easily. This also allows adding an electromagnetic compatibility shield opposite the cathode heatsinks and/or opposite the anode heatsinks more easily.

According to one example, the cathode and anode heatsinks of the first and second blocks border the separation space.

According to one example, the first and second phase heatsinks of the first block are located on one side of the cells of the first block opposite to the separation space.

According to one example, the first and second phase heatsinks of the second block are located on one side of the cells of the second block opposite to the separation space.

According to one example, the separation space comprises the external +DC and −DC connections. This allows reducing the inductance of the system.

According to one example, the external phase connection comprises a phase connector configured to connect the first and second phase heatsinks of the second block with the first and second phase heatsinks of the first block.

According to one example, the elementary switching cells of each of the first and second blocks are assembled one behind the other according to the axial direction x, so that the anode heatsink of a given cell is aligned with one amongst the first and second phase heatsinks of an immediately adjacent cell according to the axial direction x, and that the cathode heatsink of said given cell is aligned with the other one amongst the first and second phase heatsinks of the immediately adjacent cell according to the axial direction x, said anode and cathode heatsinks being electrically insulated with respect to said first and second phase heatsinks. Such an assembly allows reducing the magnetic field generated by the cells during switching. Thus, the parasitic inductance within the electronic system is reduced.

According to one example, the external +DC and −DC connections are connected to a set of bars or busbar. A busbar may be in the form of a PCB or in the form of several conductive/insulating layers assembled on top of one another (laminated busbar).

According to one example, the busbar is disposed transversely to the axial direction x, the busbar being configured to let the cooling fluid pass. In particular, the busbar may comprise passages for the flow of the cooling fluid. In this package, it may serve as an electromagnetic compatibility (EMC) shield. Hence, it is not necessary to add such an additional EMC shield.

According to one example, the busbar is in the form of a perforated grid.

According to one example, the electronic system further comprises at least one control board surrounding the elementary switching cells, so that said at least one control board forms a package configured to channel the cooling fluid according to the axial direction x. Channeling the cooling fluid directly by the control boards (PCBs) allows reducing the overall mass of the system. A distinct channeling package is no longer necessary. The PCBs are functionalised to channel the cooling fluid, in addition to controlling the power components.

According to one example, a first portion of the elementary switching cells has first and second phase heatsinks configured to be polarised according to a first phase potential and a second portion of the elementary switching cells has first and second phase heatsinks electrically insulated with respect to the first and second phase heatsinks of the first portion of the cells, and configured to be polarised according to a second phase potential different from the first phase potential.

According to one example, at least one external phase connection comprises a first external phase connection connected to the heatsinks polarised according to the first phase potential, and a second external phase connection connected to the heatsinks polarised according to the second phase potential.

According to one example, the elementary switching cells of the first portion are connected via their first and second phase heatsinks according to a central connection direction z, and the elementary switching cells of the second portion are connected via their first and second phase heatsinks according to the central connection direction z, so that the phase heatsinks of the cells of the first portion are aligned with the phase heatsinks of the cells of the second portion according to the axial direction x.

According to one example, the elementary switching cells of the first portion are connected via their first and second phase heatsinks according to the axial direction x, and the elementary switching cells of the second portion are connected via their first and second phase heatsinks according to the axial direction x, so that the phase heatsinks of the cells of the first portion are aligned with the phase heatsinks of the cells of the second portion according to a central connection direction z. Such an assembly configuration allows easily adding other elementary switching cells to each of the portions (or arm of the inverter), by aligning them one behind the other according to the direction x.

According to one example, a third portion of the elementary switching cells has first and second phase heatsinks configured to be polarised according to a third phase potential, and wherein the at least one external phase connection comprises a third external phase connection connected to the heatsinks polarised according to the third phase potential.

According to one example, the elementary switching cells of the first portion are connected via their first and second phase heatsinks according to a central connection direction z, and the elementary switching cells of the second portion are connected via their first and second phase heatsinks according to the central connection direction z, and the elementary switching cells of the third portion are connected via their first and second phase heatsinks according to the central connection direction z.

According to one example, the power components and the electrically-conductive heatsinks are assembled so as to form at least one switching cell comprising power components in series, said switching cell comprising:

A first elementary power electronics module, called first elementary module,

A second elementary power electronics module, called second elementary module, the first elementary module comprising:

an electrically-conductive heatsink configured to be polarised according to a −DC potential, called anode heatsink, and at least one electrically-conductive heatsink configured to be polarised according to a first intermediate potential, called first intermediate heatsink, an electrically-conductive heatsink configured to be polarised according to a phase potential, called phase heatsink, and a first power component, preferably integrated on or in a printed circuit board, disposed between the anode heatsink and the first intermediate heatsink, and at least one other power component in series with the first power component, preferably integrated on or in a printed circuit board, disposed between the first intermediate heatsink and the phase heatsink, the second elementary module comprising:
an electrically-conductive heatsink configured to be polarised according to a +DC potential, called cathode heatsink,
at least one electrically-conductive heatsink configured to be polarised according to a second intermediate potential, called second intermediate heatsink,
an electrically-conductive heatsink configured to be polarised according to a phase potential, called phase heatsink, and
a second power component, preferably integrated on or in a printed circuit board, disposed between the cathode heatsink and the second intermediate heatsink, and
at least one other power component in series with the second power component, preferably integrated on or in a printed circuit board, disposed between the second intermediate heatsink and the phase heatsink, According to one example, the first and second elementary modules are adjacent and connected together by an insulating lateral electrical connection between the first and second intermediate heatsinks, and by a capacitive lateral electrical connection between the anode and cathode heatsinks.

According to one example, the first and second elementary modules are connected together by a conductive electrical connection between the phase heatsinks, and by a capacitive electrical connection between the anode and cathode heatsinks.

According to one example, the first and second elementary modules are adjacent and the first and second intermediate heatsinks are connected together by an insulating electrical connection.

According to one example, the capacitive electrical connection is a capacitive lateral electrical connection interposed according to a lateral connection direction y between the anode heatsink and the cathode heatsink.

According to one example, the capacitive electrical connection is a capacitive axial electrical connection extending parallel to an axial direction x.

According to one example, the anode and cathode heatsinks, the first and second intermediate heatsinks and the phase heatsinks are configured to let a cooling fluid pass according to an axial direction x.

According to one example, the anode and cathode heatsinks are adjacent according to a lateral connection direction y, and the phase heatsinks are aligned with the anode and cathode heatsinks according to the axial direction x.

According to one example, the anode and cathode heatsinks are adjacent according to the axial direction x, and the phase heatsinks are aligned with the anode and cathode heatsinks according to a lateral connection direction y.

According to one example, the system further comprises a package configured to surround the plurality of electrically-conductive heatsinks so as to channel a passage of a cooling fluid in said electrically-conductive heatsinks.

According to one example, the system further comprises at least one electromagnetic compatibility shield configured to be polarised according to the +DC or −DC potential, at least partially surrounding the at least one phase heatsink. This allows limiting electromagnetic radiations as well as the negative effects of common mode currents when the components are switched.

According to one example, the system further comprises an electromagnetic compatibility shield configured to be polarised according to the +DC potential, at least partially surrounding the at least one phase heatsink and the at least one cathode heatsink, and/or an electromagnetic compatibility shield configured to be polarised according to the −DC potential, at least partially surrounding the at least one phase heatsink and the at least one anode heatsink.

According to one example, the system further comprises at least one control board configured to control the plurality of power components and at least partially surrounding the plurality of electrically-conductive heatsinks. This allows functionalising the control board, for example to ensure a cooling fluid channeling function, or to ensure an electromagnetic compatibility (EMC) shield function. The control board may further control the power components of the elementary modules. A control board in the PCB form is relatively light. This allows reducing the overall weight of the system.

Unless specifically stated otherwise, technical features described in detail for a given embodiment may be combined with technical features described in the context of other embodiments described as non-limiting examples. In particular, the number, the shape and the connection of the elementary modules illustrated in the figures may be combined so as to form another embodiment which is not necessarily illustrated or described. Of course, such an embodiment is not excluded from the invention.

In the present invention, the first and second heatsinks are referred to as anode or cathode for clarity. This denomination does not limit the invention. The anode and cathode heatsinks form electrodes. These electrodes may be an anode, a cathode, an emitter, a collector, a source, a drain, etc. These electrodes may be inverted according to the passing direction of the electronic component for example.

In the present invention, MOSFET transistors are preferably used which include a diode in their structure. It is possible to use "IGBT" type transistors, i.e. Insulated Gate Bipolar Transistors (IGBT). In this package, the IGBT transistor is preferably associated with an antiparallel diode, for example located in the PCB.

Other transistor architectures may be used, for example yet without limitation:
a HEMT type (acronym for "High Electron Mobility Transistor") transistor, which is a high electron mobility field effect transistor, sometimes also referred to as heterostructure field effect transistor,
an insulated gate field effect transistor more commonly called MOSFET (acronym for "Metal Oxide Semiconductor Field Effect Transistor").

Other components, such as thyristors, Gate Turn-Off Thyristors (GTO thyristor or more simply GTO, standing for "Gate Turn-Off" Thyristor), may also be used.

These transistors and components are well known and commonly used in the field of power electronics, in particular for static power converters. Next, the terms "transistor" or "component" or "power component" therefore refer, without limitation, to all of the aforementioned transistor and component architectures.

By "electronic system", it should be understood, in the field of power electronics, systems preferably operating with electric currents having intensities comprised between 10 A and 1,000 A, and/or electric voltages comprised between 10 V and 10,000 V, preferably between 10 V and 5,000 V, and preferably between 10 V and 1,000 V.

According to the invention, the electronic system consists of several elementary modules each comprising power components ensuring in particular one or more electronic switch function(s).

Hence, the system is advantageously modular and allows making numerous structures of static converters, such as a switching cell, a multilevel converter, an interleaved chopper.

These modules may be connected according to the three directions of space x, y and z. A lateral connection is made according to the direction y. A central connection is made along z. An axial connection is made along x. A reference frame xyz, preferably orthonormal, is attached to the appended drawings. In particular, it allows easily understanding the different connections between the modules. In particular, the direction x defines a flow direction of a cooling fluid throughout the electronic system. In the disclosed examples, cooling is typically achieved by forced air convection. Alternatively, cooling may be achieved by liquid cooling with or without phase change, provided that the liquid is electrically-insulating. Alternatively, cooling may be achieved by natural convection.

The principle of modularity of the electronic system according to the invention is illustrated throughout the following examples.

The reader will usefully refer to the contents of the documents FR3088137 A1 and WO2020094663 A1 for the production of elementary power modules and for the connection of these modules together so as to form a power electronics system. The characteristics of the heatsinks and of the conductive, capacitive or insulating connections described in these documents are in particular incorporated in the present application. Other embodiments are disclosed in the following. Part of the description relates to the "external" connections of the elementary modules, as opposed to the "internal" connections previously described in the documents FR3088137 A1 and WO2020094663 A1.

In general, and unless explicitly stated otherwise, the different heatsinks X2, Y2, U2, V2, A2, B2, I2, J2 are phase heatsinks polarised according to a phase potential, the heatsinks X1, U1, A1, I1, are anode heatsinks polarised according to a −DC potential, the heatsinks Y1, V1, B1, J1 are cathode heatsinks polarised according to a +DC potential.

FIG. 1 shows an elementary switching cell formed by two elementary power modules X, Y connected laterally to each other. In particular, the first power module X comprises a printed circuit board or PCB X0 interposed between a first heatsink X1 and a second heatsink X2. The second power module Y comprises a printed circuit board or PCB Y0 interposed between a first heatsink Y1 and a second heatsink Y2. The first and second printed circuit boards X0, Y0 respectively comprise at least first and second power components X00A, Y00A, preferably first and second transistors. The selection of power components integrated in a PCB allows simplifying the external electrical connections with a control board. Alternative solutions other than PCBs, allowing in particular interposing a power component between the heatsinks, may also be considered.

For each of the elementary modules, there is no electrically-insulating element between the PCB X0, respectively Y0, and the heatsinks X1, X2, respectively Y1, Y2. In order to limit the thermal interfaces, the transistors X00A, Y00A are preferably bare chips.

Alternatively, the transistors X00A, Y00A may be assembled beforehand in individual packages.

In general, the heatsinks are configured to let a cooling fluid pass at least according to the direction x.

The first heatsink X1 may be configured to be polarised according to a −DC potential. It is referred to as anode heatsink in the following.

The first heatsink Y1 may be configured to be polarised according to a +DC potential. It is referred to as cathode heatsink in the following.

The second heatsinks X2, Y2 may be configured to be polarised according to a phase potential. They are referred to as phase heatsinks in the following.

Figure 2:
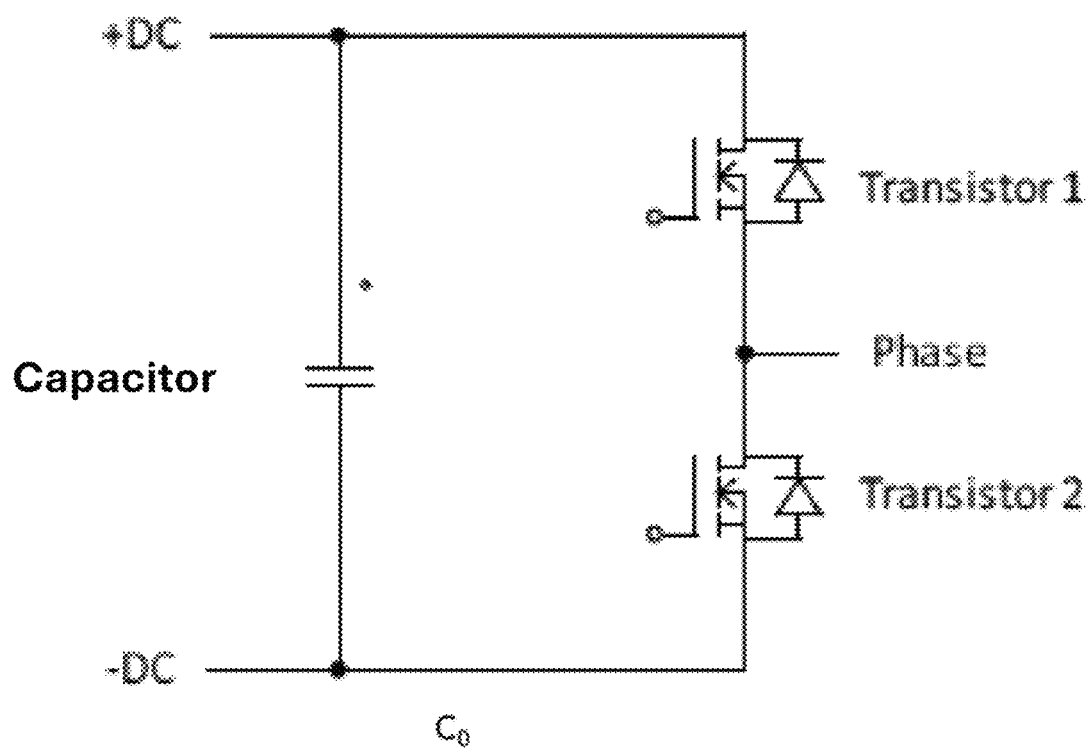
FIG. 2 represents the electrical diagram of the switching cell illustrated in FIG. 1.

In this example, to form an elementary switching cell C0 as illustrated by the electrical diagram of FIG. 2, the anode and cathode heatsinks X1, Y1 are laterally connected together by a capacitive lateral connection X1Y1CP. The phase heatsinks X2, Y2 are laterally connected together by a conductive lateral connection X2Y2C.

The conductive lateral connection X2Y2C illustrated in FIG. 1 is achieved by means of a single and unique phase heatsink XY comprising the heatsinks X2, Y2. According to another possibility, the heatsinks X2, Y2 are distinct and connected together by soldering, by sintering, or by gluing with a conductive glue.

Figure 3:
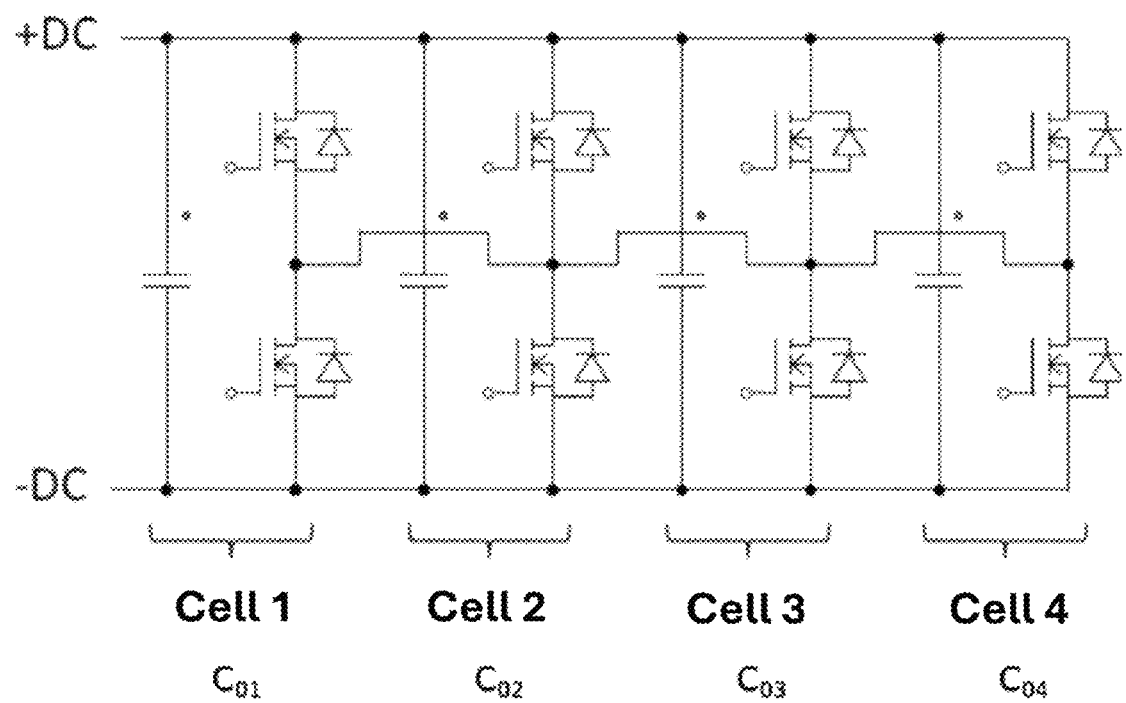
FIG. 3 represents an electrical diagram of four switching cells in parallel, according to an embodiment of the present invention.

FIG. 3 illustrates an electrical diagram of an electronic system in which four elementary switching cells C01, C02, C03, C04 are connected in parallel. In practice, in the following, the cell C01 comprises the anode and cathode heatsinks X1, Y1 and the phase heatsinks X2, Y2. The cell C02 comprises the anode and cathode heatsinks U1, V1 and the phase heatsinks U2, V2. The cell C03 comprises the anode and cathode heatsinks A1, B1 and the phase heatsinks A2, B2. The cell C04 comprises the anode and cathode heatsinks I1, J1 and the phase heatsinks I2, J2. For clarity, the references are not necessarily indicated on each of the appended figures. Nevertheless, a person skilled in the art will be able to replicate without difficulty the different electronic system configurations based on the description and the illustrations.

FIGS. 4 to 25 illustrate different practical embodiments of the electronic system defined in FIG. 3.

Figure 4:
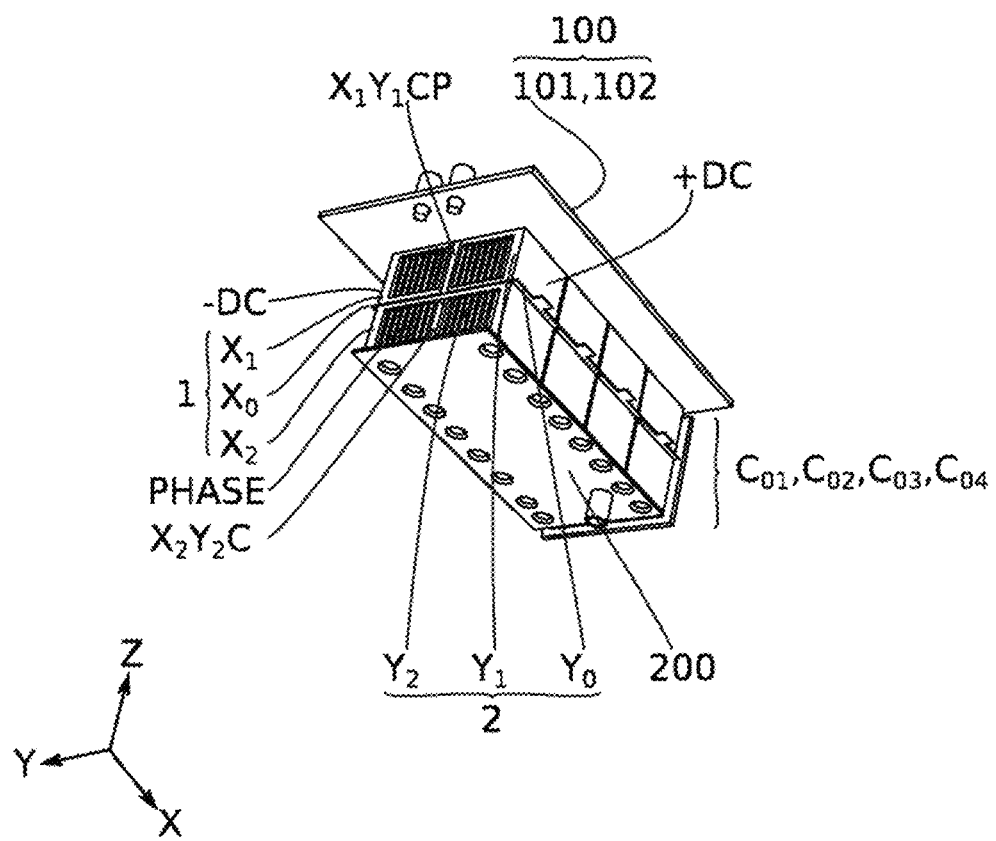
FIG. 4 schematically illustrates an electronic system comprising an assembly of four switching cells in parallel, according to an embodiment of the present invention.

According to a first embodiment illustrated in FIG. 4, the four elementary cells C01, C02, C03, C04 are aligned one behind the other according to the direction x.

The electrical connection between the different elementary cells C01, C02, C03, C04 is ensured by an external phase connection 200 between the different phase heatsinks X2, Y2, U2, V2, A2, B2, I2, J2, and by an external −DC connection 101 between the different anode heatsinks X1, U1, A1, I1, and by an external +DC connection 102 between the different cathode heatsinks Y1, V1, B1, J1. The external phase connection 200 is typically in the form of a metal plate 200.

The external −DC and +DC connections 101, 102 are typically in the form of a busbar 100. The busbar 100 may be of several types, for example and in a known manner: plates, a laminated busbar or a PCB.

The metal plate 200 and the busbar 100 also allow ensuring mechanical holding of the elementary cells C01, C02, C03, C04. The electrical connection between the metal plate 200 and the elementary cells on the one hand, and between the busbar 100 and the elementary cells on the other hand, may be achieved in different manners. For example and in a known manner, this connection may be done by screws, or by soldering, or by brazing, or by an electrically and thermally conductive glue, or by sintering, or by transient liquid phase sintering (TLPS). A connection by screws enables easy assembly and disassembly of the cells. Thus, defective cells can be easily and advantageously replaced. Brazing or soldering allow improving the electrical contact.

In this example, the elementary cells C01, C02, C03, C04 may be in contact with each other or spaced apart.

Preferably, the metal plate 200 and the busbar 100 are located on either side of the elementary cell block C01, C02, C03, C04, on two opposite sides. This enables a better distribution of the electric current between the elementary cells.

Figure 5A:
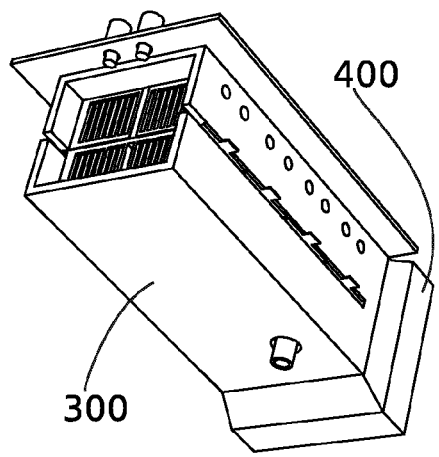
FIGS. 5A to 5D schematically illustrate different elements (package, electromagnetic compatibility shields, control boards, etc.) assembled to the electronic system illustrated in FIG. 4, according to an embodiment of the present invention.

FIGS. 5A to 5D show elements that may be added around the elementary switching cell block illustrated in FIG. 4. As illustrated in FIG. 5A, a package 300 may advantageously be disposed around the elementary cell block. This package 300 typically allows channeling along x the cooling fluid in the heatsinks of the elementary cells. This allows enhancing cooling performance.

Preferably, this package 300 is electrically insulating. It may be made in different ways, for example by 3D printing, by machining, or by plastic or resin injection. To enhance the tightness of the package 300 or to fill in the spaces enabling air to pass between the heatsinks, an insulating foam or any other material capable of ensuring the tightness can be used. This package 300 may comprise fasteners 400 for one or more fan(s).

Figure 5B:
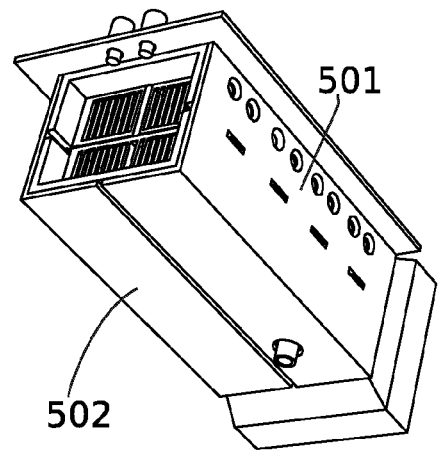

As illustrated in FIG. 5B, electromagnetic compatibility (EMC) shields 501, 502 may advantageously be disposed around the elementary cell block. These EMC shields 501, 502 are typically configured to limit the electromagnetic radiation as well as the common mode currents when switching the power components of the switching cells. These shields 501, 502 are typically in the form of conductive plates polarised according to fixed potentials. Preferably, these EMC shields 501, 502 are at least disposed opposite the phase heatsinks, and preferably opposite the anode and cathode heatsinks. Preferably, the shield 501 is located on one side of the cathode heatsinks and polarised according to the +DC potential. Preferably, the shield 502 is located on one side of the anode heatsinks and polarised according to the −DC potential. The EMC shields 501, 502 may be in the form of metal plates, films, fabrics. It is also possible to use PCBs comprising one or more conductive track(s), for example in the form of a grid, polarised according to one or more potential(s). The mass of such a shield 501, 502 based on a PCB is advantageously reduced compared to the mass of a metal plate. It is also possible to consider making the control circuits of the transistors directly on these "PCB" type shields 501, 502.

Figure 5C:
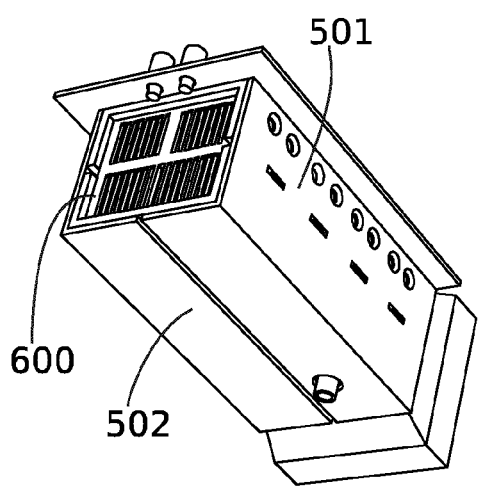

To further limit electromagnetic compatibility problems, it is possible to add a shield 600 in front of the air outlet and/or air inlet, as illustrated in FIG. 5C. This shield 600 may be perforated or textured in order to let the cooling fluid pass. It is typically polarised according to a fixed +DC or −DC potential. Alternatively, it may be grounded. Advantageously, the EMC shields 501, 502, 600 may cover the phase heatsinks connected to the phase potential as much as possible. Indeed, the phase potential is that one that varies the most over time. Hence, EMC shields are more efficient compared to phase heatsinks. According to one possibility, the anode and cathode heatsinks are not covered by the EMC shields. This allows limiting the mass or the size of the system.

Figure 5D:
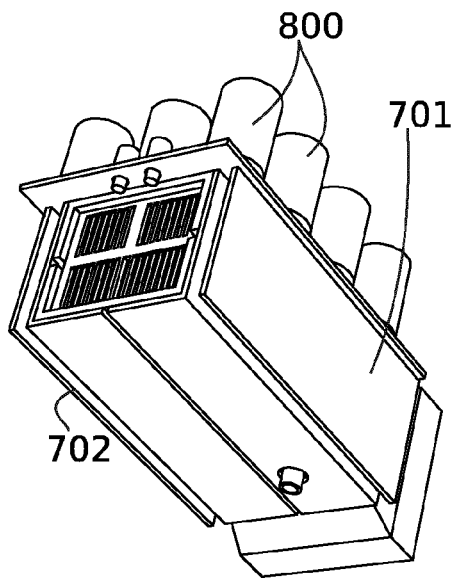

As illustrated in FIG. 5D, control boards 701, 702 may be connected to the switching cells, for example to control the power components of these cells. Decoupling capacitors 800 may also be added at the busbar 100. An air filter (not illustrated) may also be added to limit fouling on the heatsinks. This allows reducing the risks of dielectric breakdown. Preferably, this filter is selected so as to impose the least possible pressure drops. This allows maintaining good efficiency for cooling of the electronic system.

Figure 6:
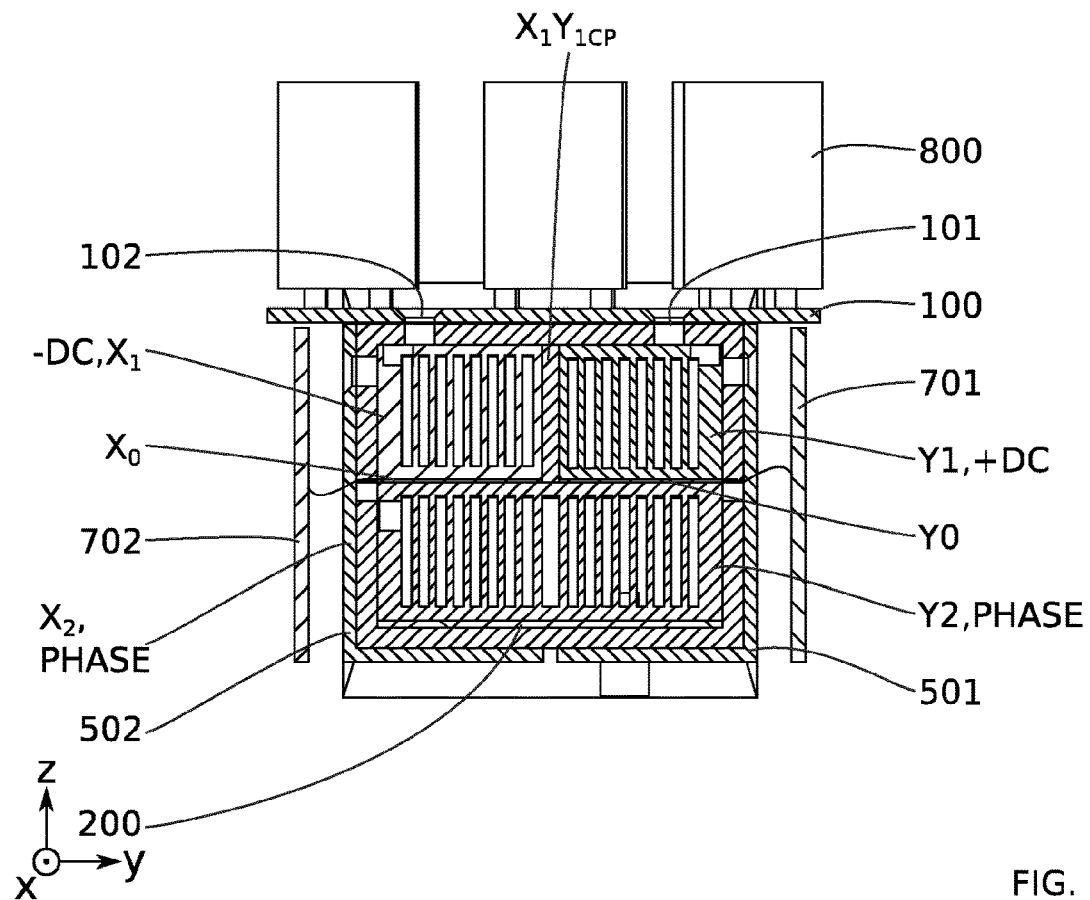
FIG. 6 illustrates in section the electronic system illustrated in FIG. 4.

FIG. 6 shows a sectional view of the electronic system shown in FIG. 5D. This view allows seeing more specifically some electrical connections, such as the capacitive lateral connection X1Y1CP between the anode X1 and cathode Y1 heatsinks, the conductive lateral connection X2Y2C between the phase heatsinks X2, Y2, and the EMC shield connections between the shields 501, 502 and the anode and cathode heatsinks X1, Y1.

The sectional view of FIG. 6 also shows the connection between the control boards 701, 702 and the PCBs X0, Y0 of the elementary modules.

Other arrangements of elementary cells may be considered to form the electronic system illustrated in FIG. 3.

Thus, different principles of arrangement of these elementary cells are disclosed in the following. The additional elements of the system, such as the plates 200, busbar 100, package 300, 400, shields 501, 502, 600, boards 701, 702, are not systematically included in the appended drawings. This does not exclude the possibility of adding these elements as described hereinabove.

Figure 7:
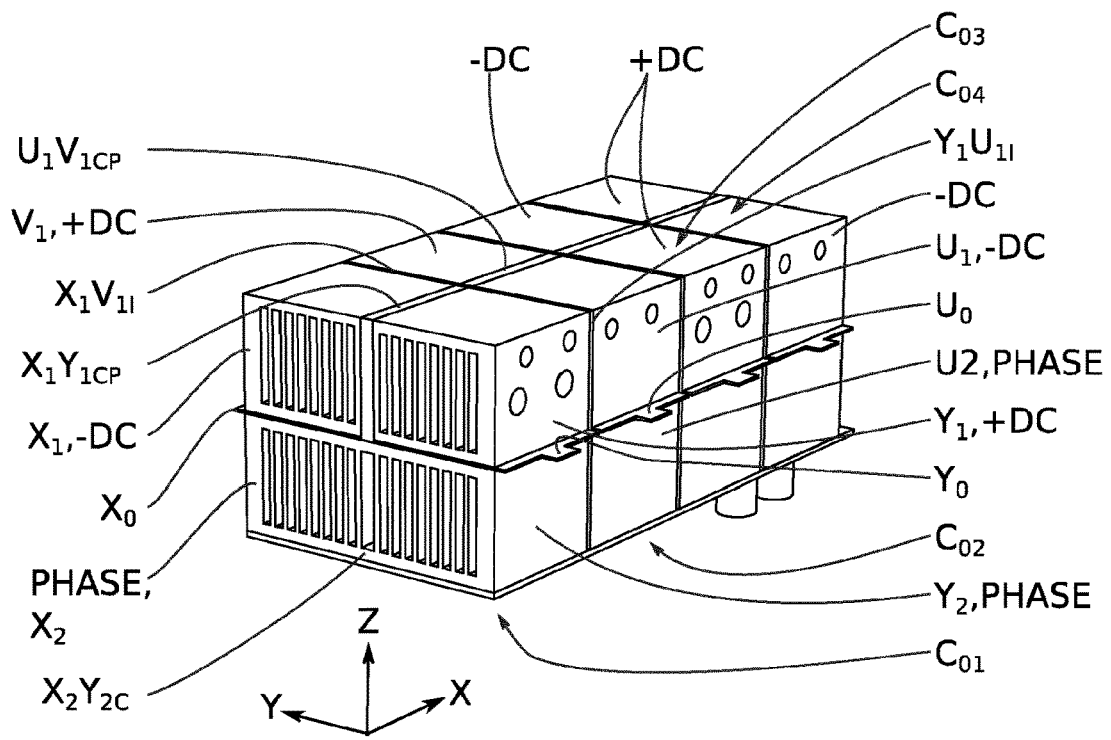
FIG. 7 schematically illustrates an electronic system comprising an assembly of four switching cells in parallel, according to another embodiment of the present invention.

FIG. 7 illustrates a possible arrangement in which the arrangement of the anode and cathode heatsinks is modified compared to the previous example. In this example, the anode and cathode heatsinks are alternated along x. This allows alternating the +DC and −DC potentials. Thus, reverse magnetic fields are created. This reduces the parasitic inductance within the switching cells.

It is herein necessary to electrically insulate the heatsinks, which are not at the same potential, from each other. This may be done by spacing them apart and/or putting an insulating material therebetween. For example, the cathode heatsink Y1 is connected to the anode heatsink U1 by an insulating axial connection Y1U1I. The anode heatsink X1 is connected to the cathode heatsink V1 by an insulating axial connection X1V1I.

Other non-illustrated possibilities for arranging the elementary cells aligned along x may also be considered. A person skilled in the art will easily know how to select which arrangement of cells best suits his needs, thanks to the modularity of the electronic system presented herein.

FIGS. 8 to 20 show different embodiments of this same electronic system (four switching cells in parallel) based on a transverse juxtaposition, according to an axial direction x, of two blocks of elementary cells 10, 20.

Figure 8:
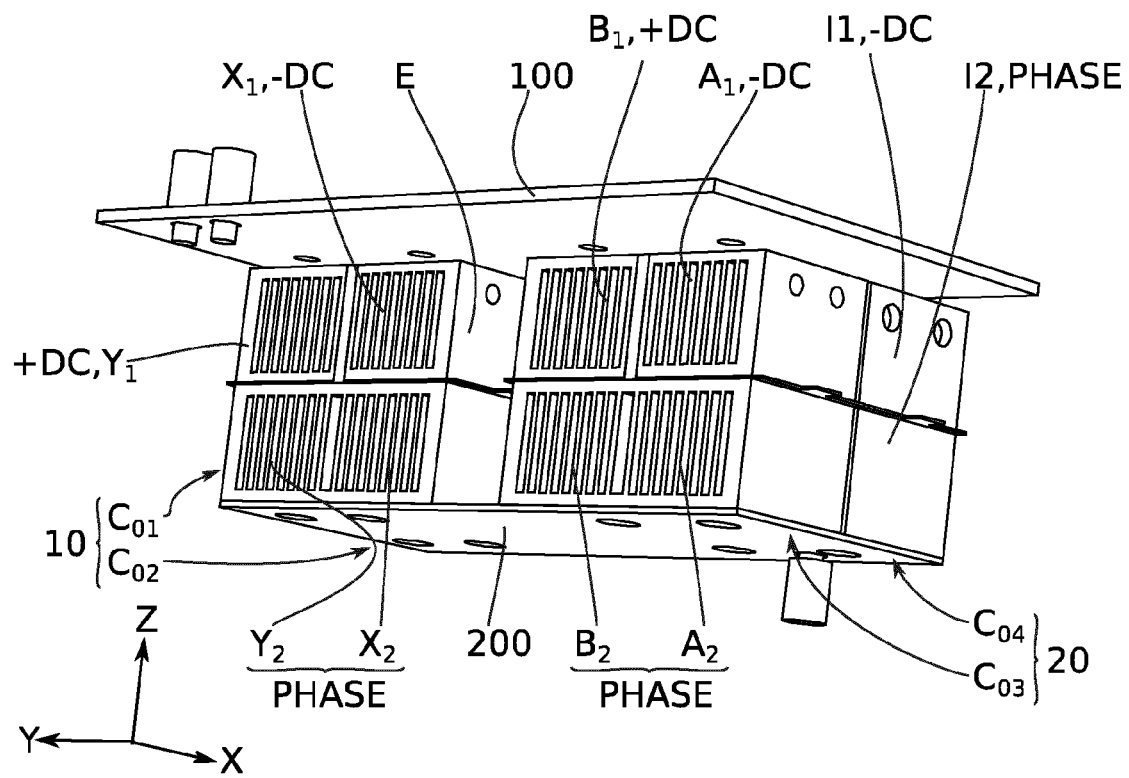
FIG. 8 schematically illustrates an electronic system comprising an assembly of four switching cells in parallel, according to another embodiment of the present invention.

Thus, as illustrated in FIG. 8, a first block 10 of two cells C01, C02 is disposed next to a second block 20 of two cells C03, C04.

The first block 10 comprises two elementary cells C01, C02 aligned one behind the other according to the direction x, like before. The second block 20 comprises two elementary cells C03, C04 aligned one behind the other according to the direction x, like before. This arrangement allows reducing the thickness of the heatsinks to be crossed along x by the cooling fluid. This allows reducing the pressure drops of the fluid flow in the system.

The first and second blocks 10, 20 may be separated by a separation space E. This allows electrically insulating the anode heatsinks X1, V1 of the first block 10 from the cathode heatsinks B1, J1 of the second block 20. This also allows reserving access for the connections of the blocks 10, 20.

Like before, the busbar 100 electrically connects the anode heatsinks together, and the cathode heatsinks together. The connection of the phase heatsinks is achieved by a metal plate 200.

Figure 9:
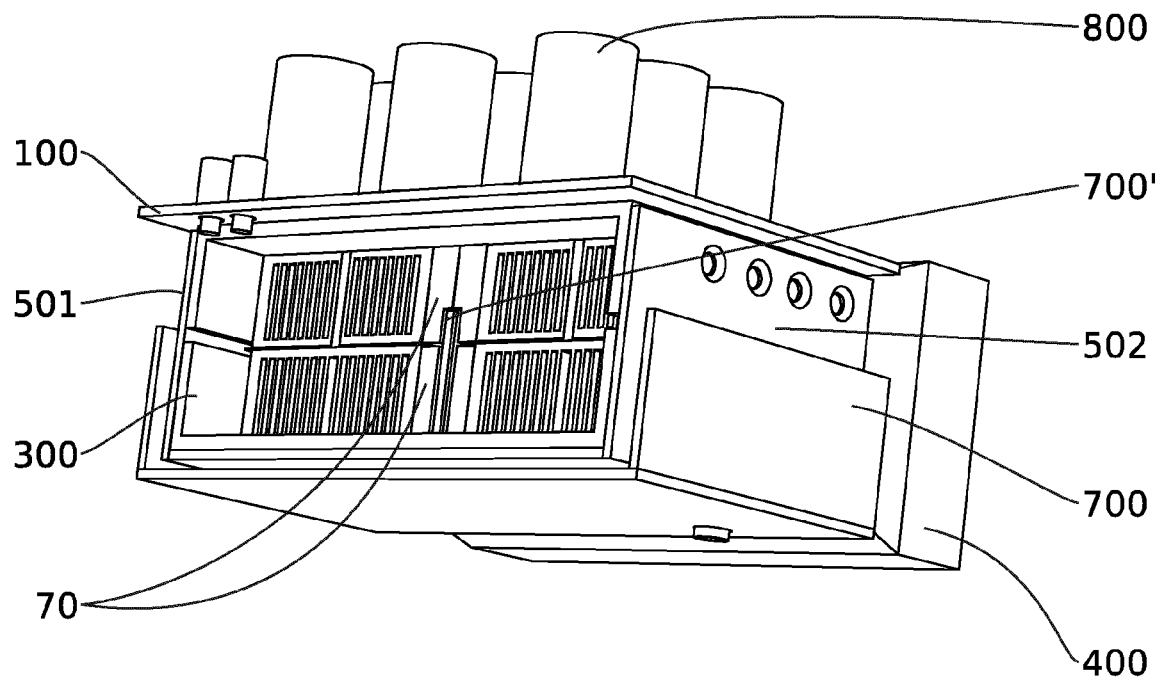
FIG. 9 schematically illustrates different elements (package, electromagnetic compatibility shields, control boards, etc.) assembled to the electronic system illustrated in FIG. 8, according to an embodiment of the present invention.

As illustrated in FIG. 9, a package 300, 400, EMC shields 501, 502, 600 (the EMC shield 600 opposite the cell blocks is not represented in FIG. 9 in order to leave the inside of the system visible) and control boards 700, 700' may be added around the elementary cell blocks.

In this example, a control board 700' is disposed in the separation space E between the first and second blocks, in order to control the transistors located at the centre of the system. This control board 700' may also be a simple connector connected to the external control board 700. According to a preferred possibility, the separation space E is draughtproofing by an insulating material or another device allowing at least partially blocking the air flow. This allows forcing the flow of the cooling fluid in the heatsinks. The cooling efficiency is improved. The insulating material may be massive. Alternatively and advantageously, this material may be in the form of a deformable foam. This allows limiting the mass of the system. This also allows easily obstructing some areas, for example around the control board 700'. According to another possibility, the separation space is draught proofed by resin injection, in particular around the control board 700'.

Like before, other possibilities of arrangement of the elementary cells may be considered.

Figure 10:
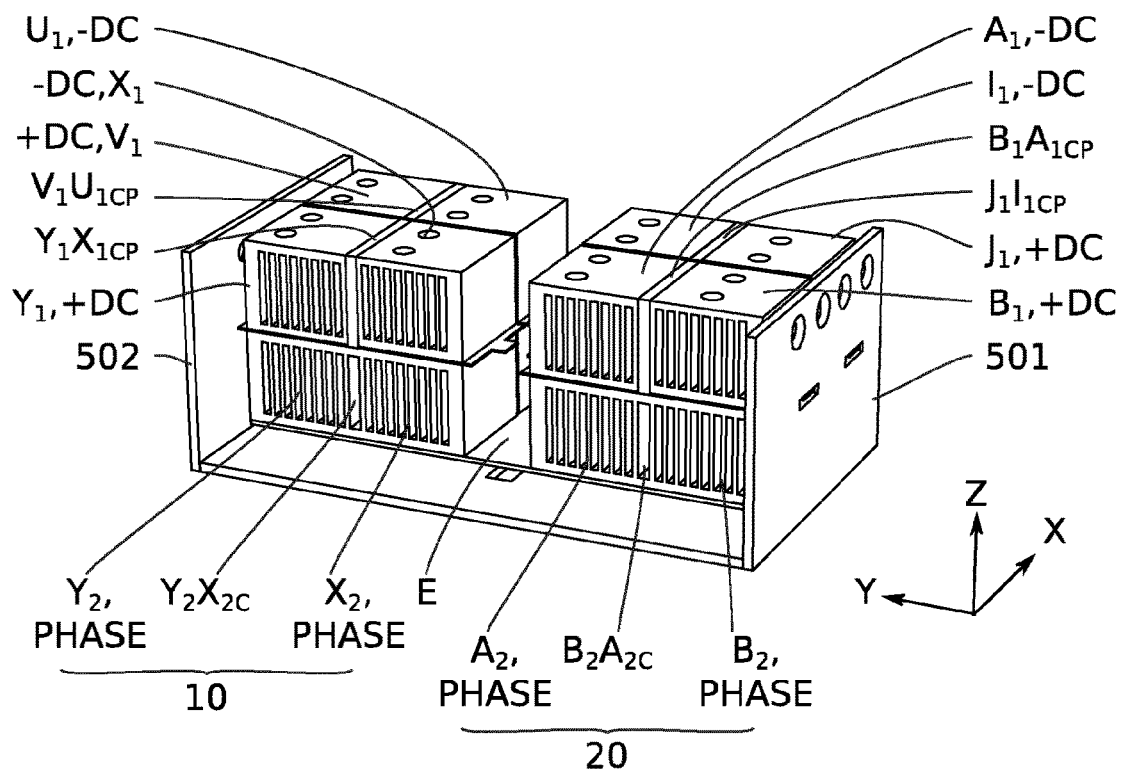
FIG. 10 schematically illustrates an electronic system comprising an assembly of four switching cells in parallel, according to another embodiment of the present invention.

FIG. 10 shows an example of an arrangement where all cathode heatsinks are located on the sides of the blocks 10, 20, opposite to the separation space E. This allows forming a continuous EMC shield 501 around the phase heatsinks and the cathode heatsinks B1, J1, Y1, V1. Thus, the EMC shield 501 is formed by a single metal plate.

Like before, other non-represented possibilities of arrangement are also possible. The cathode and anode heatsinks may be reversed. The cathode and anode heatsinks may be alternated in a staggered manner.

Figure 11:
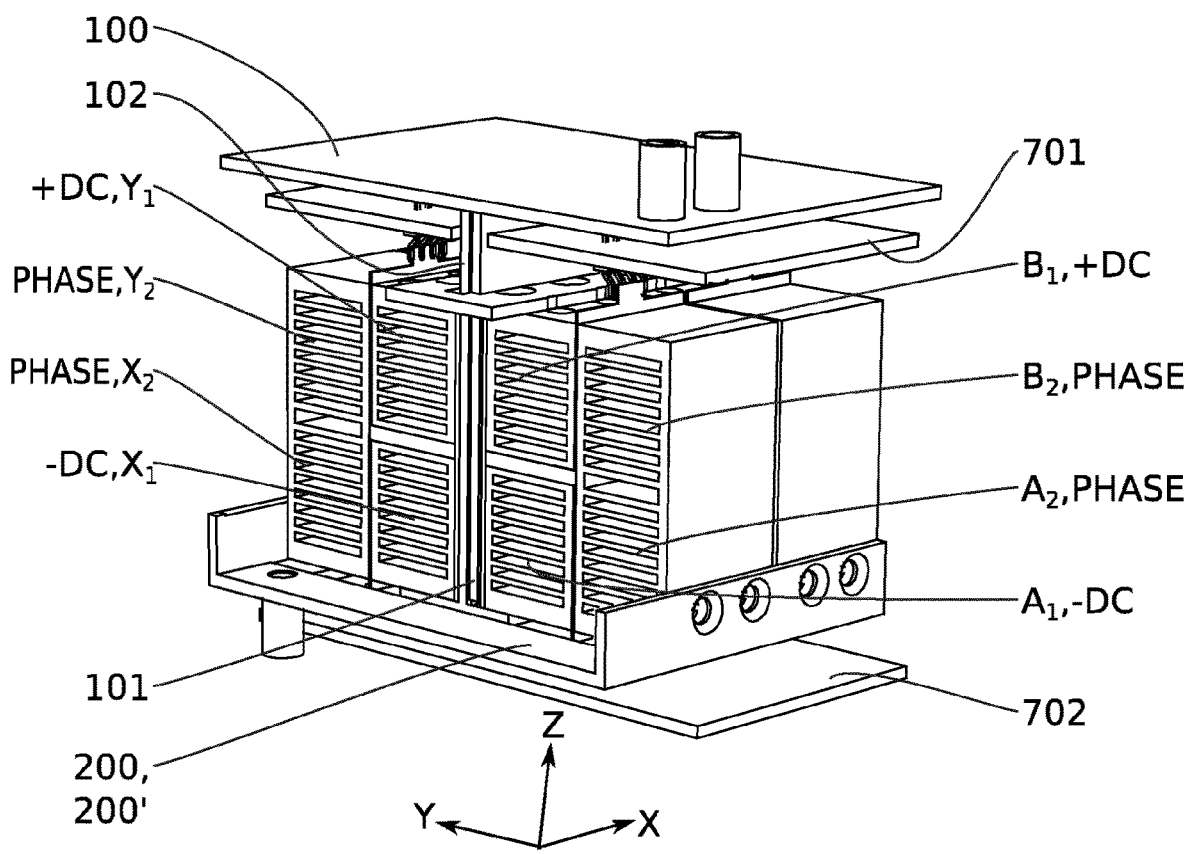
FIG. 11 schematically illustrates an electronic system comprising an assembly of four switching cells in parallel, according to another embodiment of the present invention.

FIG. 11 shows another embodiment where all of the anode and cathode heatsinks of the two blocks 10, 20 border the separation space E. In this example, the separation space E comprises the external +DC and −DC connections 101, 102. These external +DC and −DC connections 101, 102 are typically in the form of plates connected to the busbar 100. Such plates 101, 102 parallel to each other over their entire length and polarised according to +DC and −DC allow reducing the parasitic inductance.

The control boards 701, 702 are simply disposed on either side of the blocks. The external phase connection 200 comprises a phase connector 200' configured to connect the phase heatsinks located on the opposite sides of the cell blocks.

Figure 12:
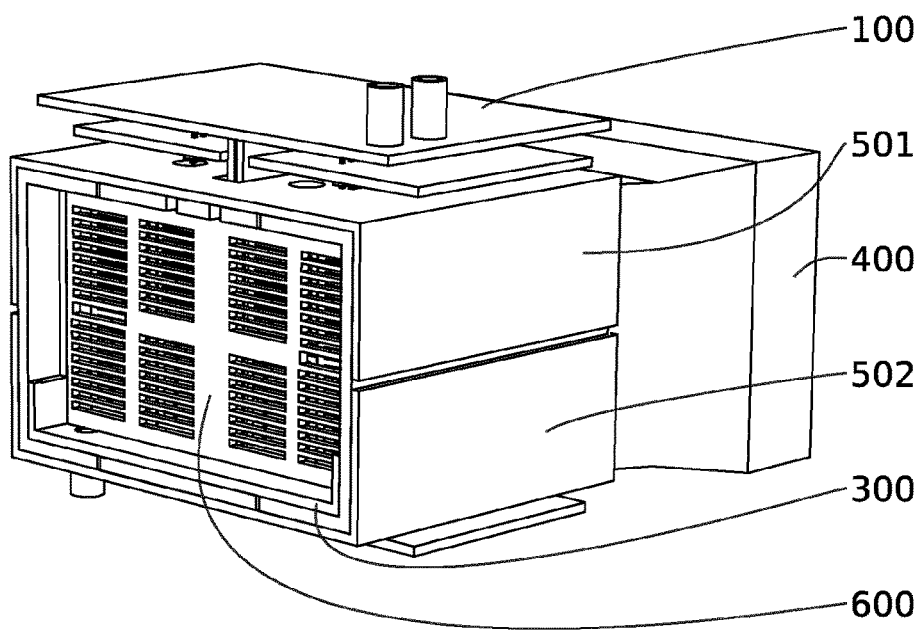
FIG. 12 schematically illustrates different elements (package, electromagnetic compatibility shields, control boards, etc.) assembled to the electronic system illustrated in FIG. 11, according to an embodiment of the present invention.

FIG. 12 illustrates the additional elements (package 300, 400, EMC shields 501, 502, 600) added to the electronic system illustrated in FIG. 11.

Figure 13:
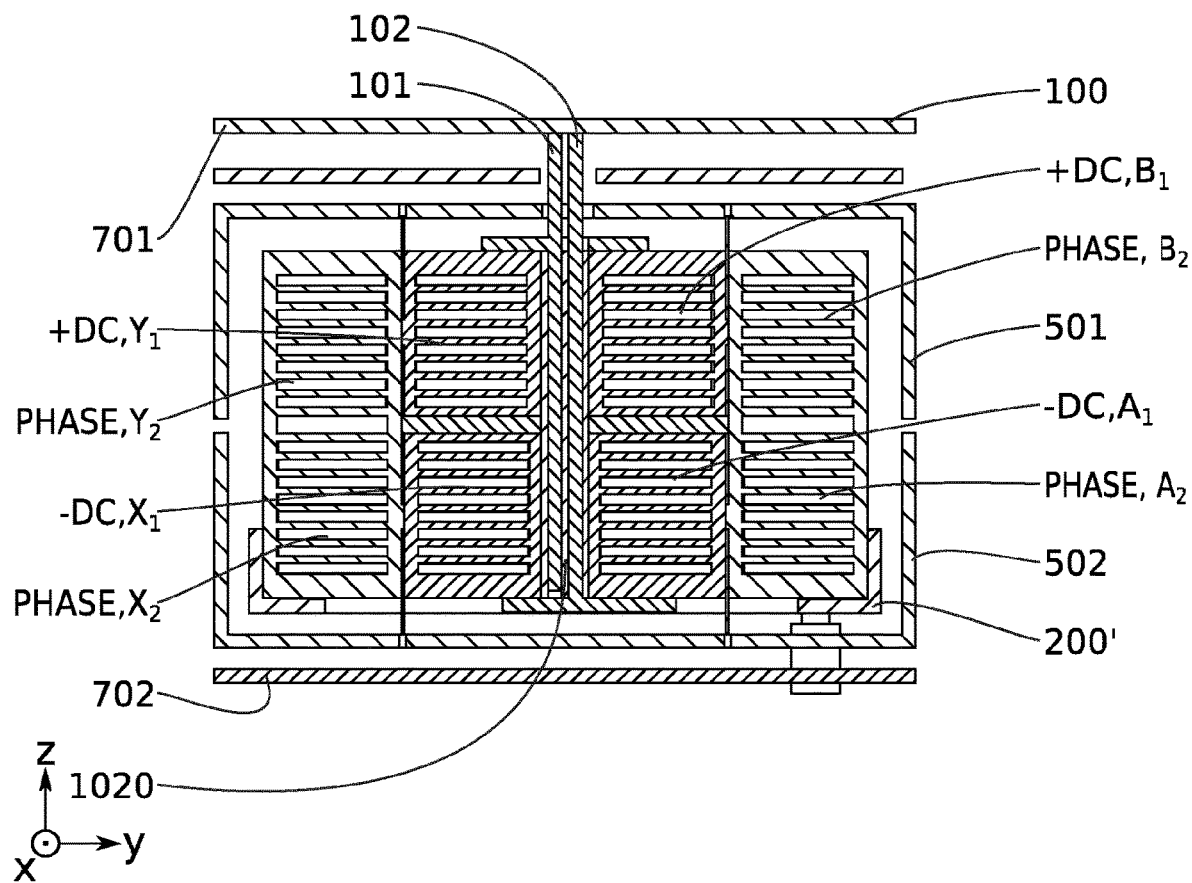
FIG. 13 illustrates in section the electronic system illustrated in FIG. 12.

FIG. 13 is a sectional view of the system, showing in particular the electrical connections between the plate 101 and the cathode heatsinks Y1, B1 on the one hand, and between the plate 102 and the anode heatsinks X1, A1 on the other hand. These connections are herein represented by screws but they may be made alternatively by soldering, by gluing, or by sintering for example.

According to another embodiment, the busbar 100 may be placed perpendicularly to the air flow. The busbar 100 may then be massive if it is far enough from the cells so as to leave at least one passage for the circulation of air. According to one possibility illustrated in FIG. 14A, the busbar 100 comprises perforations for the passage of air. In this package, it can advantageously serve as an EMC shield. This limits the number of EMC shields to be added to the system. The overall mass of the system is reduced. A plate 101 may connect the cathode heatsinks to the busbar 100. A plate 102 may connect the anode heatsinks to the busbar 100, as illustrated in FIG. 14B. Like before, a phase connector 200' may allow connecting the phase heatsinks together.

Figure 14A:
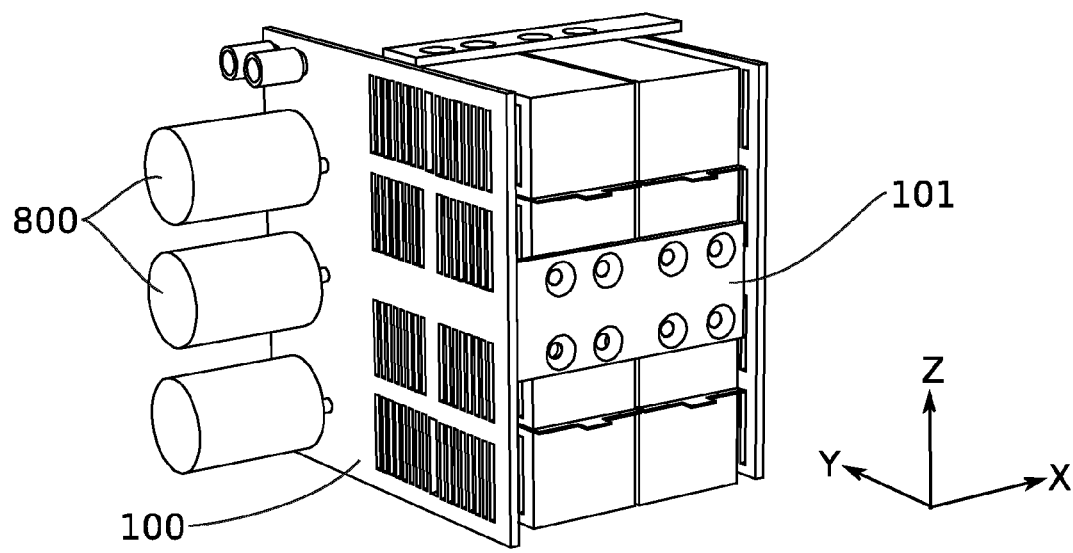
FIGS. 14A and 14B schematically illustrate an electronic system comprising an assembly of four switching cells in parallel, according to another embodiment of the present invention.
Figure 14B:
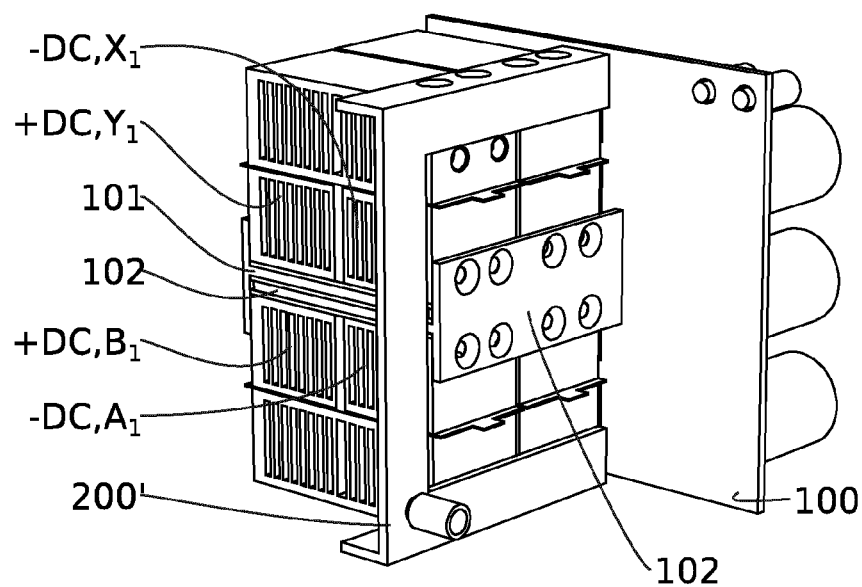
Figure 15:
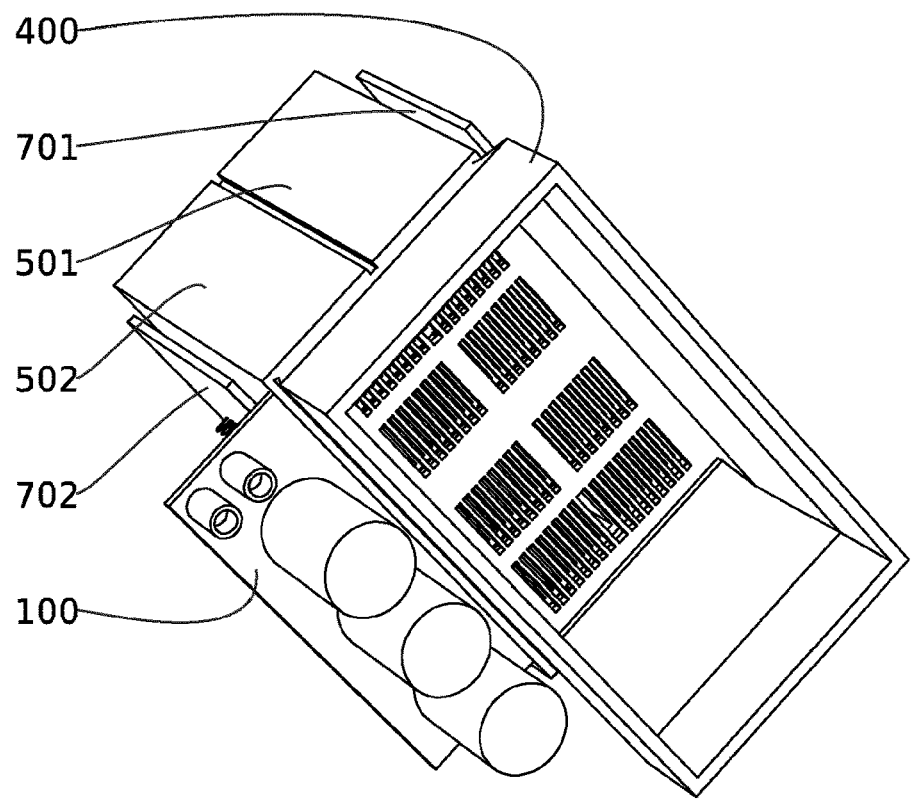
FIG. 15 schematically illustrates different elements (package, electromagnetic compatibility shields, control boards, etc.) assembled to the electronic system illustrated in FIGS. 14A and 14B, according to an embodiment of the present invention.

FIG. 15 illustrates the additional elements (package 300, 400, EMC shields 501, 502, control boards 701, 702) added to the electronic system illustrated in FIGS. 14A and 14B.

In FIG. 15, the perforated busbar 100 is located on the fan side. Alternatively, it may be placed on the side opposite to the fan.

Figure 16:
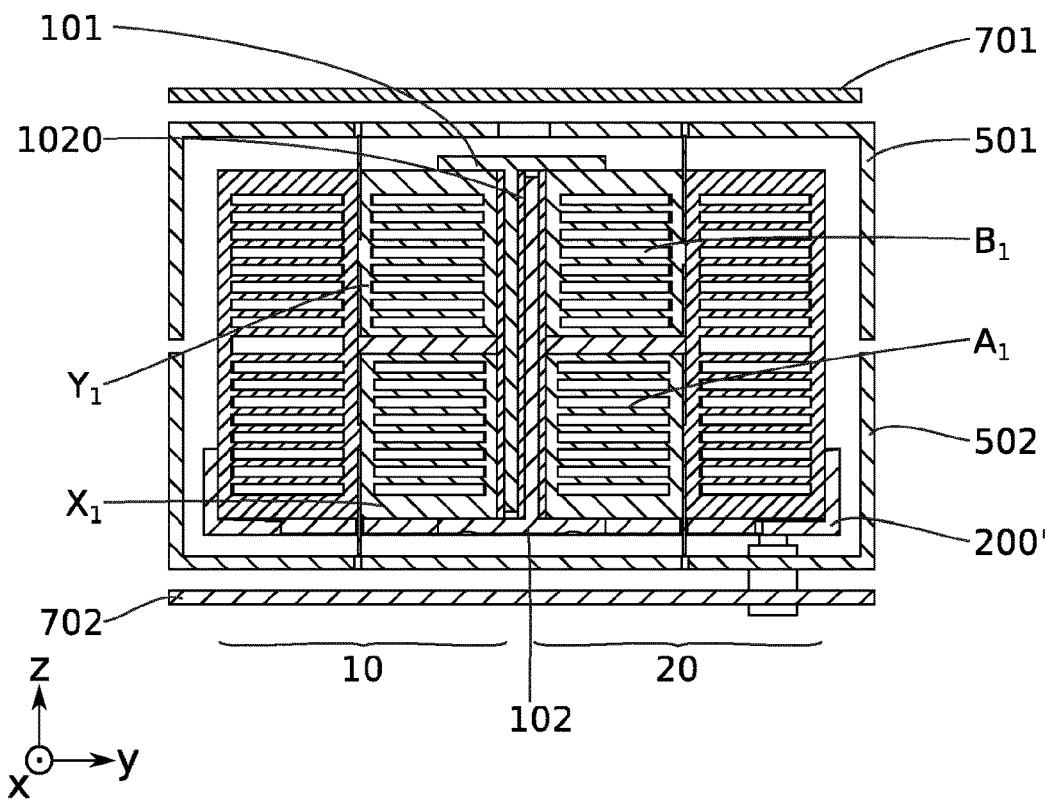
FIG. 16 illustrates in section the electronic system illustrated in FIG. 15.
Figure 17:
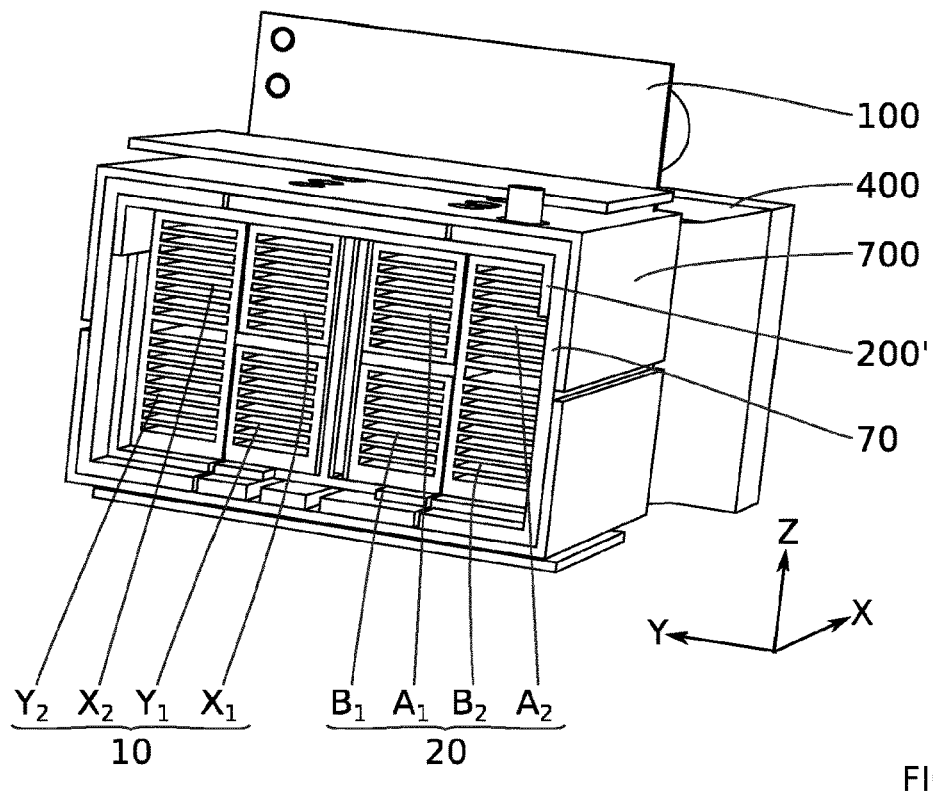
FIG. 17 schematically illustrates an electronic system comprising an assembly of four switching cells in parallel, according to another embodiment of the present invention.

FIG. 16 is a sectional view of the system, showing in particular the electrical connections between the plate 101 and the cathode heatsinks Y1, B1 on the one hand, and between the plate 102 and the anode heatsinks X1, A1 on the other hand. These connections are herein represented by screws but they may be made alternatively by soldering, by gluing, or by sintering for example. The plates 101, 102 are parallel to each other over their entire length in order to reduce the inductance as much as possible with respect to the external capacitors 800. The design of the plates 101, 102 may be adapted depending on the needs. For example, if the need is to reduce the mass of the system, shorter plates may be suitable (as illustrated in FIG. 17). If the need is to limit the parasitic inductance as much as possible, plates parallel to each other over their entire length are preferable, as illustrated in FIG. 16.

In one possibility illustrated in FIG. 17, PCBs 700 may be disposed around the cells to channel air in the system. Henceforth, the PCBs 700 replace the package 300. This allows reducing the overall mass of the system. The PCBs 700 may also ensure the EMC shield function. They may also ensure the function of controlling the transistors of the switching cells. Thus, the package based on the PCBs is advantageously functionalised. An insulating material 70, such as a foam, may be used to draughtproof the spaces between the package and the elementary cell blocks.

Figure 18:
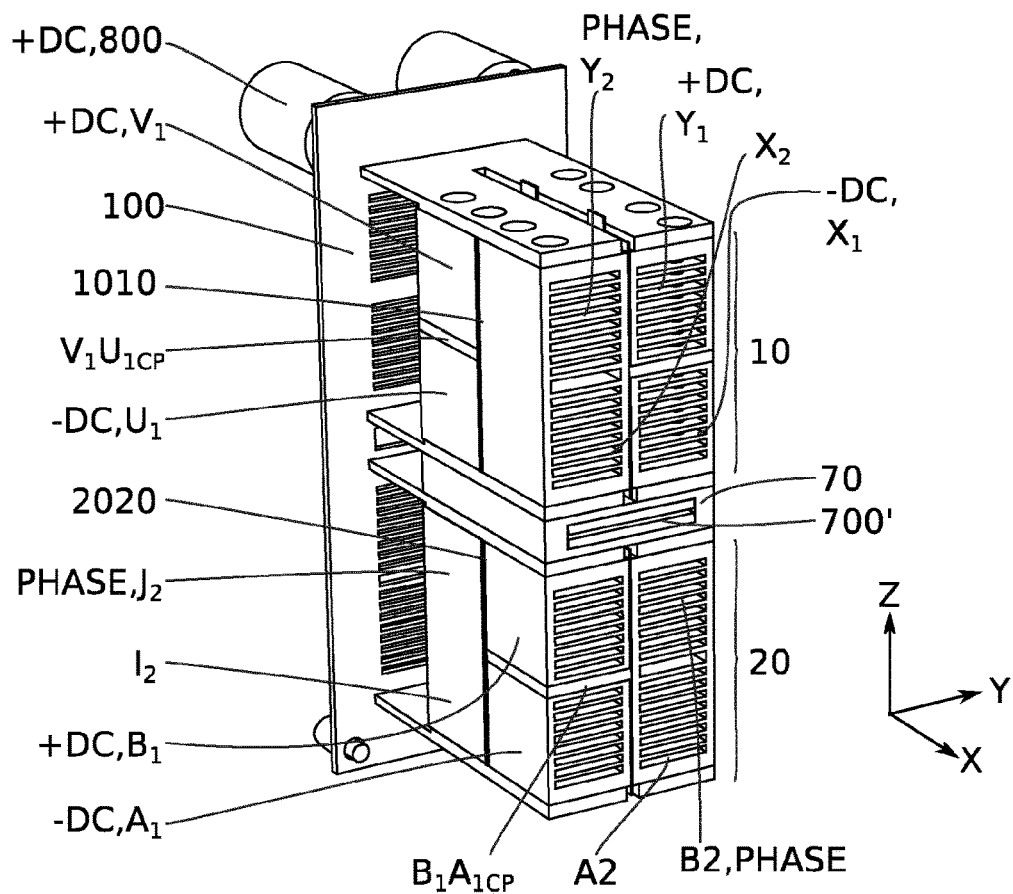
FIG. 18 schematically illustrates an electronic system comprising an assembly of four switching cells in parallel, according to another embodiment of the present invention.

FIG. 18 illustrates another possibility of arrangement of the switching cells in parallel. The relative arrangement of the anode and cathode heatsinks within each block 10, 20 herein allows reducing the magnetic field generated by the cells during switching. Thus, the parasitic inductance is reduced. The connection between the different heatsinks and the busbar 100 may be achieved by multilayer conductive plates 101, 102, 200. These multilayer conductive plates may be in the form of PCBs or laminated busbars. Alternatively, the connections may be achieved by simple plates separated by electrical insulators.

Electrical insulators 1010, 2020 may be provided between the phase heatsinks of a given cell and the anode and cathode heatsinks of an adjacent cell.

Figure 19:
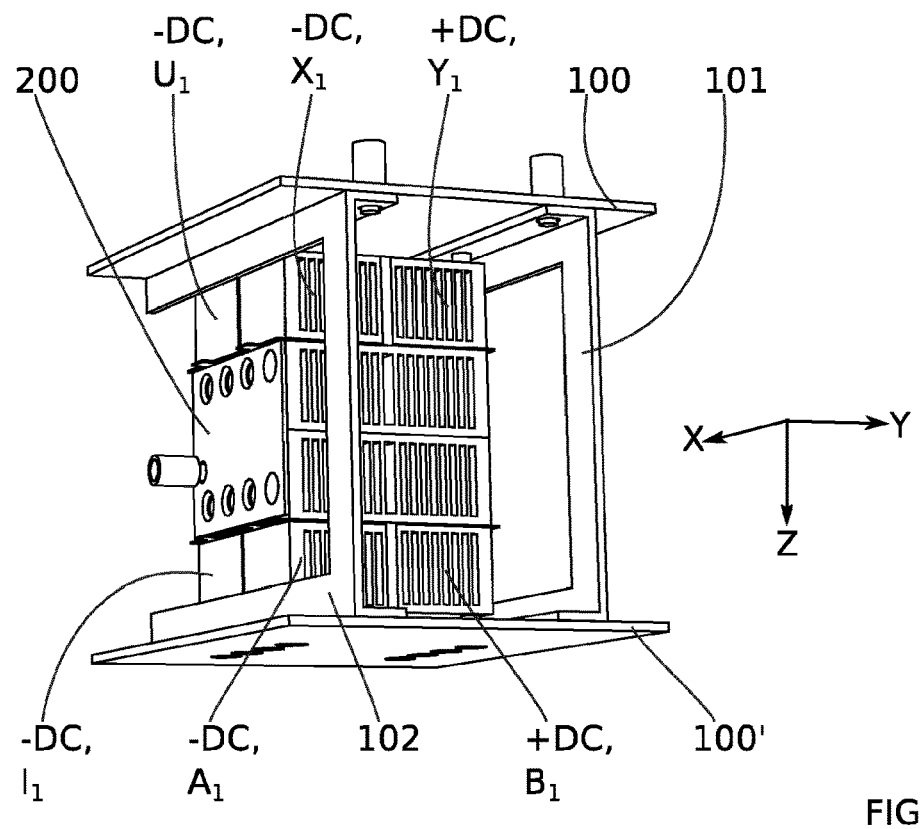
FIG. 19 schematically illustrates an electronic system comprising an assembly of four switching cells in parallel, according to another embodiment of the present invention.

FIG. 19 shows an embodiment where the two cell blocks are adjacent by their phase heatsinks. A phase plate 200 connects the phase heatsinks together. In this package, the busbar may be split into several portions 100, 100'. Connectors 101, 102 may then allow connecting these two portions 100, 100' to the cathode and anode heatsinks.

Figure 20:
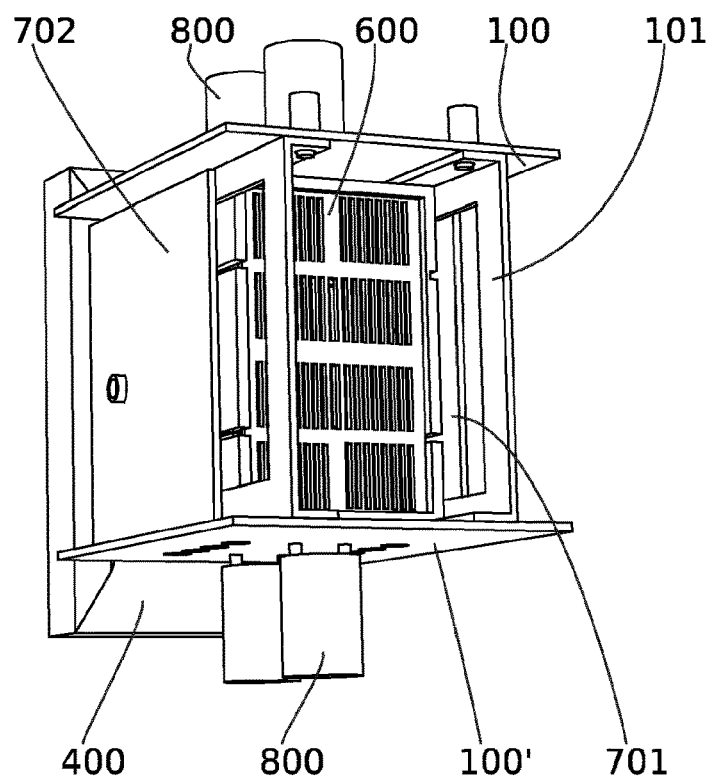
FIG. 20 schematically illustrates different elements (package, electromagnetic compatibility shields, control boards, etc.) assembled to the electronic system illustrated in FIG. 19, according to an embodiment of the present invention.

FIG. 20 illustrates the additional elements (package 400, EMC shield 600, functionalised control boards 701, 702, decoupling capacitors 800) added to the electronic system illustrated in FIG. 19.

FIGS. 21 to 25 show different embodiments of this same electronic system (four switching cells in parallel) based on a transverse juxtaposition, according to an axial direction x, of all elementary cells.

Figure 21:
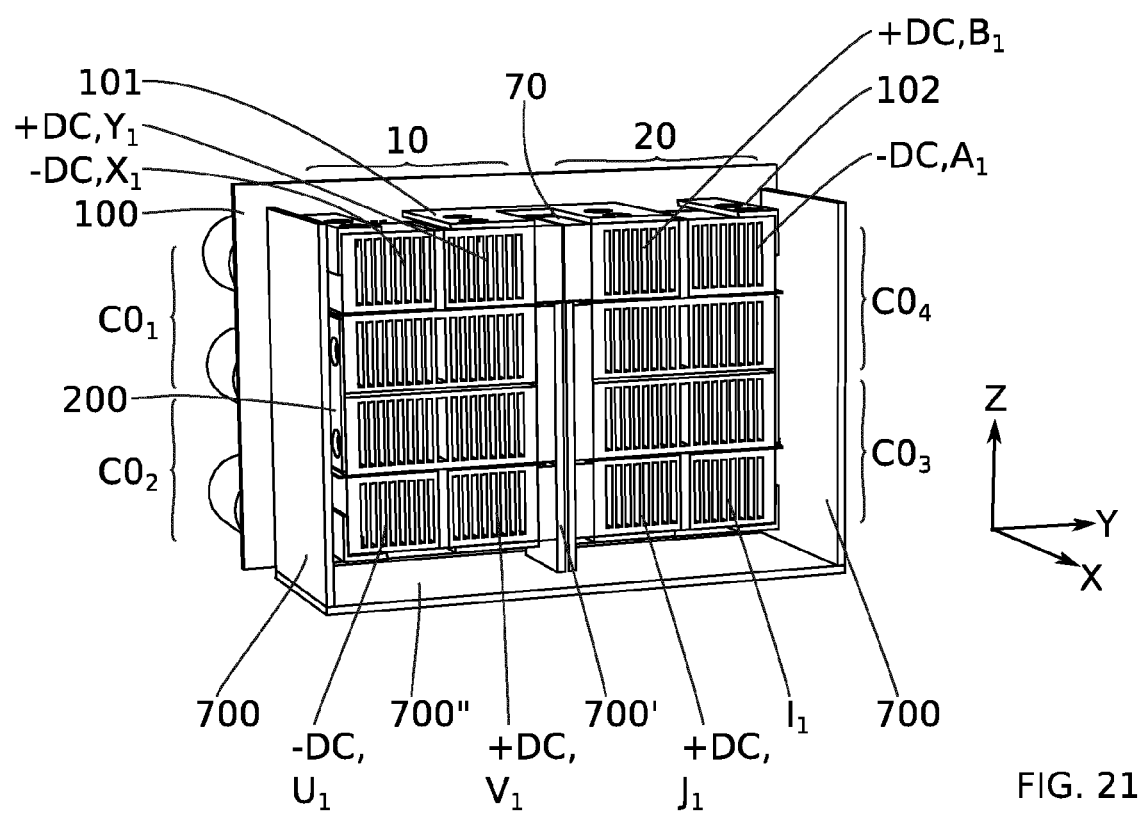
FIG. 21 schematically illustrates an electronic system comprising an assembly of four switching cells in parallel, according to another embodiment of the present invention.

As illustrated in FIG. 21, the four switching cells may be juxtaposed along y and/or z. The heatsinks are disposed in a single row, parallel to the plane yz. This allows further reducing the pressure drops in the heatsinks during cooling.

Like before, a first block 10 of two cells C01, C02 is disposed next to a second block 20 of two cells C03, C04.

The first block 10 comprises two elementary cells C01, C02 connected by a central connection between the phase heatsinks X2, Y2, U2, V2. The second block 20 comprises two elementary cells C03, C04 connected by a central connection between the phase heatsinks A2, B2, I2, J2. This arrangement allows reducing the thickness of the heatsinks to be crossed along x by the cooling fluid. This allows reducing the pressure drops of the fluid flow in the system.

The first and second blocks 10, 20 may be separated by a separation space E, like before. This space may typically comprise one or more control board(s) 700'. An insulating foam 70 may draughtproof the space remaining between the boards 700' and the cell blocks 10, 20.

In the embodiment illustrated in FIG. 21, the busbar 100 is placed perpendicularly to the air flow. It is configured to deliver the +DC, −DC and phase potentials. It is connected to the heatsinks by metal plates 101, 102, 200. Control of the power components may be performed from a motherboard 700" connected to the control boards 700, 700' which bring the control signals up to the transistors of the elementary switching cells.

Figure 22:
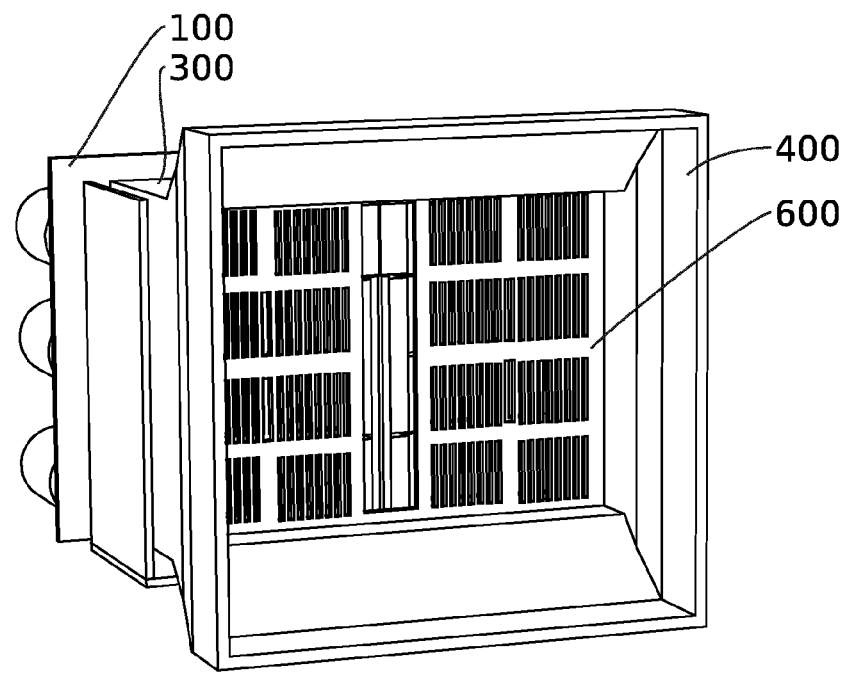
FIG. 22 schematically illustrates different elements (package, electromagnetic compatibility shields, control boards, etc.) assembled to the electronic system illustrated in FIG. 21, according to an embodiment of the present invention.

FIG. 22 illustrates the additional elements (package 300, 400, EMC shield 600, decoupling capacitors 800) added to the electronic system illustrated in FIG. 21.

Figure 23:
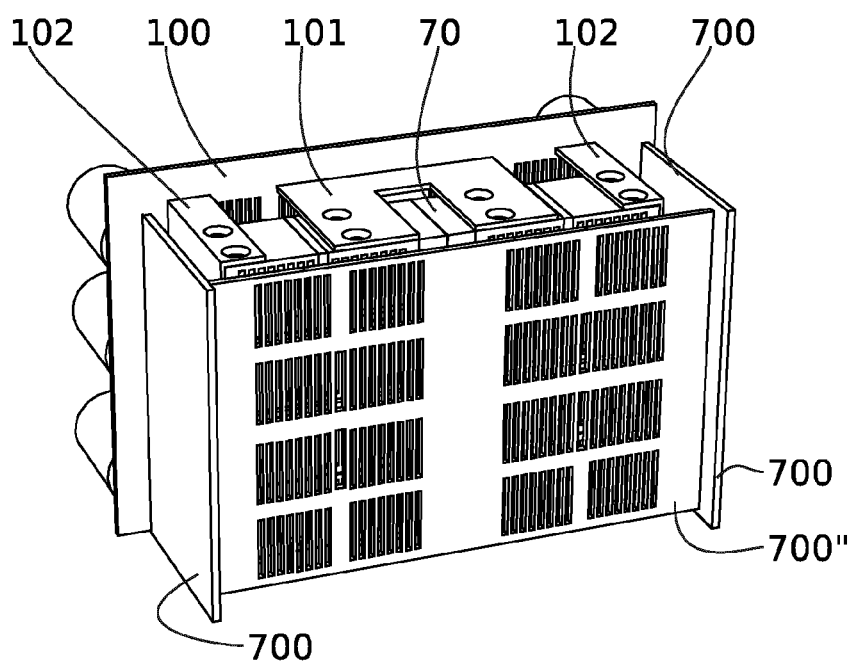
FIG. 23 schematically illustrates an electronic system comprising an assembly of four switching cells in parallel, according to another embodiment of the present invention.

In the embodiment illustrated in FIG. 23, the motherboard 700" is perforated and placed perpendicular to the air flow, like the busbar 100. It can then serve as an EMC shield. Preferably, this board is connected to all of the other control boards 700, 700' (on the side and between the heatsinks).

Figure 24:
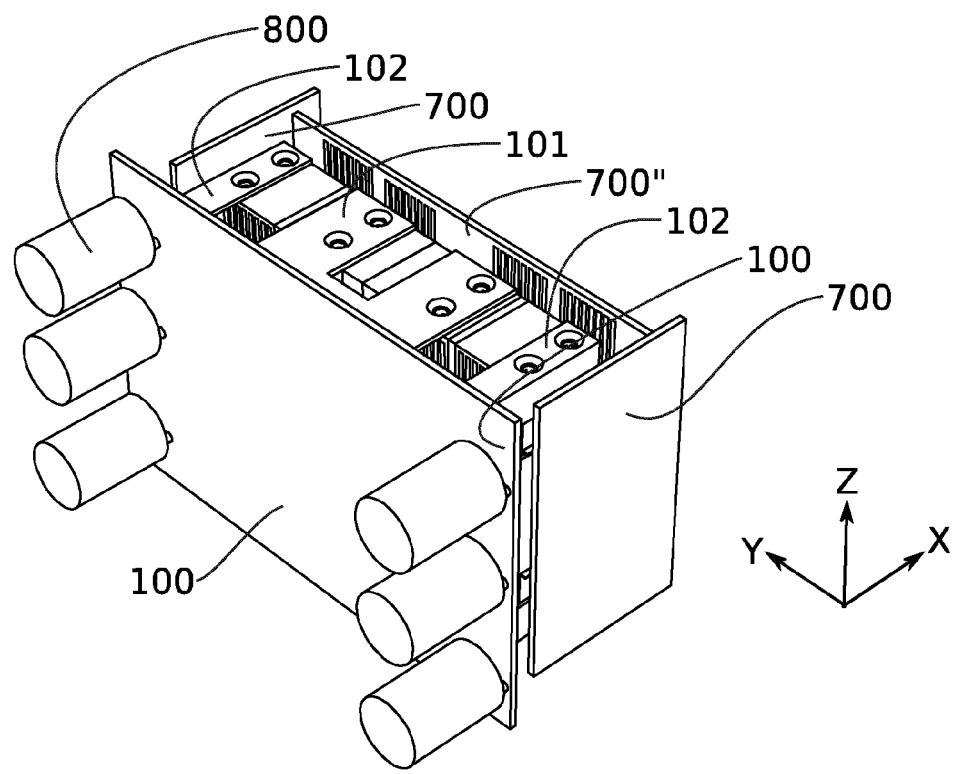
FIG. 24 schematically illustrates an electronic system comprising an assembly of four switching cells in parallel, according to another embodiment of the present invention.
Figure 25:
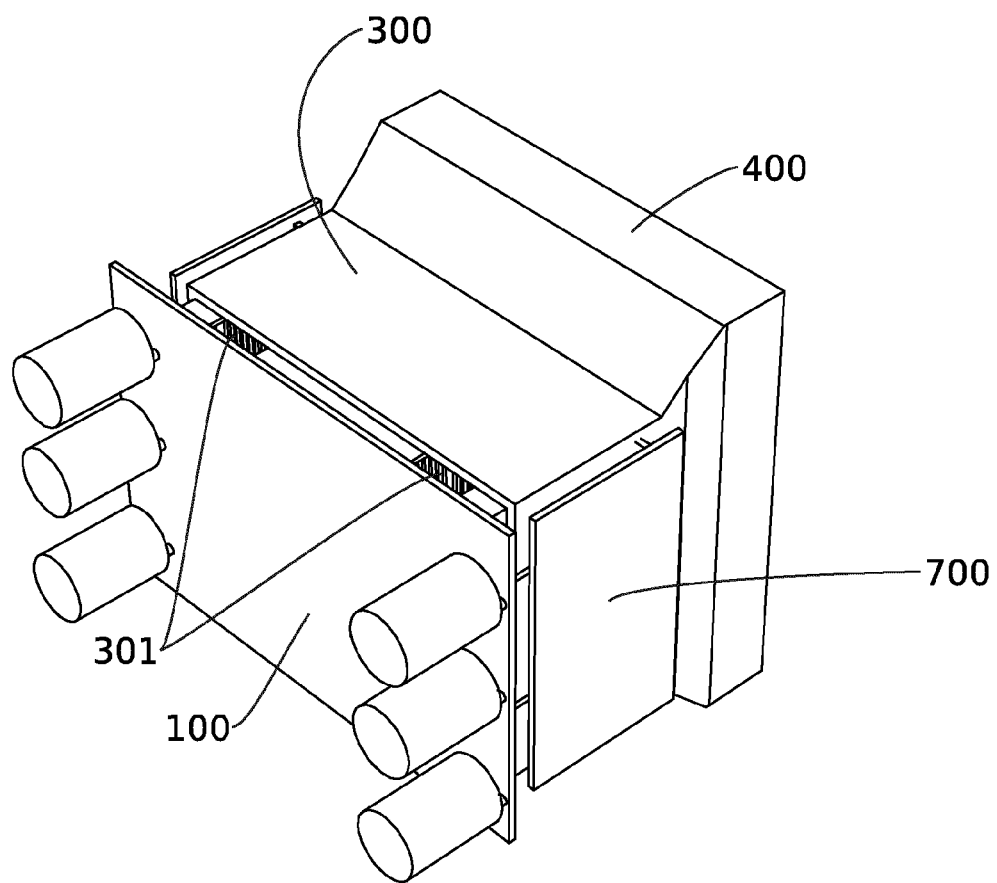
FIG. 25 schematically illustrates different elements (package, electromagnetic compatibility shields, control boards, etc.) assembled to the electronic system illustrated in FIG. 24, according to an embodiment of the present invention.

In the embodiment illustrated in FIGS. 24 and 25, the motherboard 700" is perforated and placed perpendicular to the air flow. The busbar 100 is massive and placed perpendicularly to the air flow. In this package, the busbar 100 is far enough from the cells so as to leave at least one passage 301 for air circulation, for example between the package 300 and the busbar 100.

The previously-described cell arrangements illustrate the modularity of the electronic system. Other electronic systems, typically multi-phase systems with potentially many components in parallel, may be easily derived from the above-described arrangements.

Next, embodiments of single-phase and three-phase inverters are presented.

Figure 26:
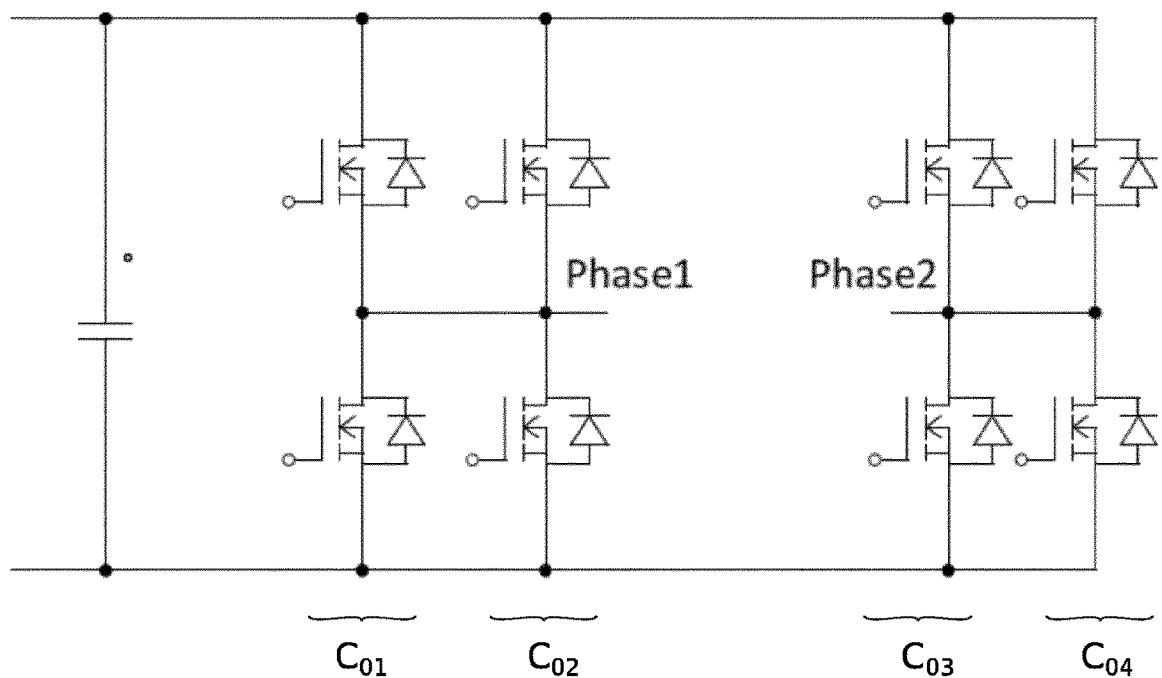
FIG. 26 represents the electrical diagram of a single-phase inverter comprising two times two switching cells in parallel, according to an embodiment of the present invention.

FIG. 26 illustrates an electrical diagram of a two-level single-phase voltage inverter electronic system, in which each inverter arm comprises two switching cells in parallel.

Figure 27:
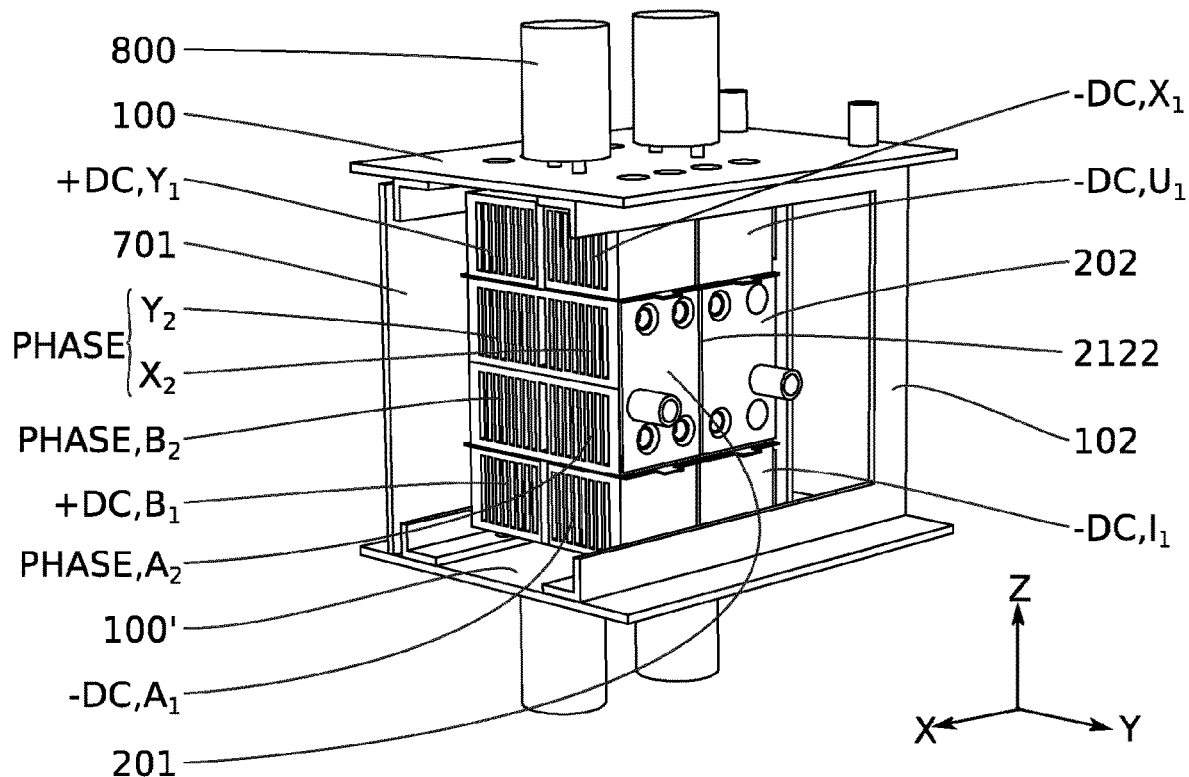
FIG. 27 schematically illustrates a single-phase inverter, according to an embodiment of the present invention.
Figure 28:
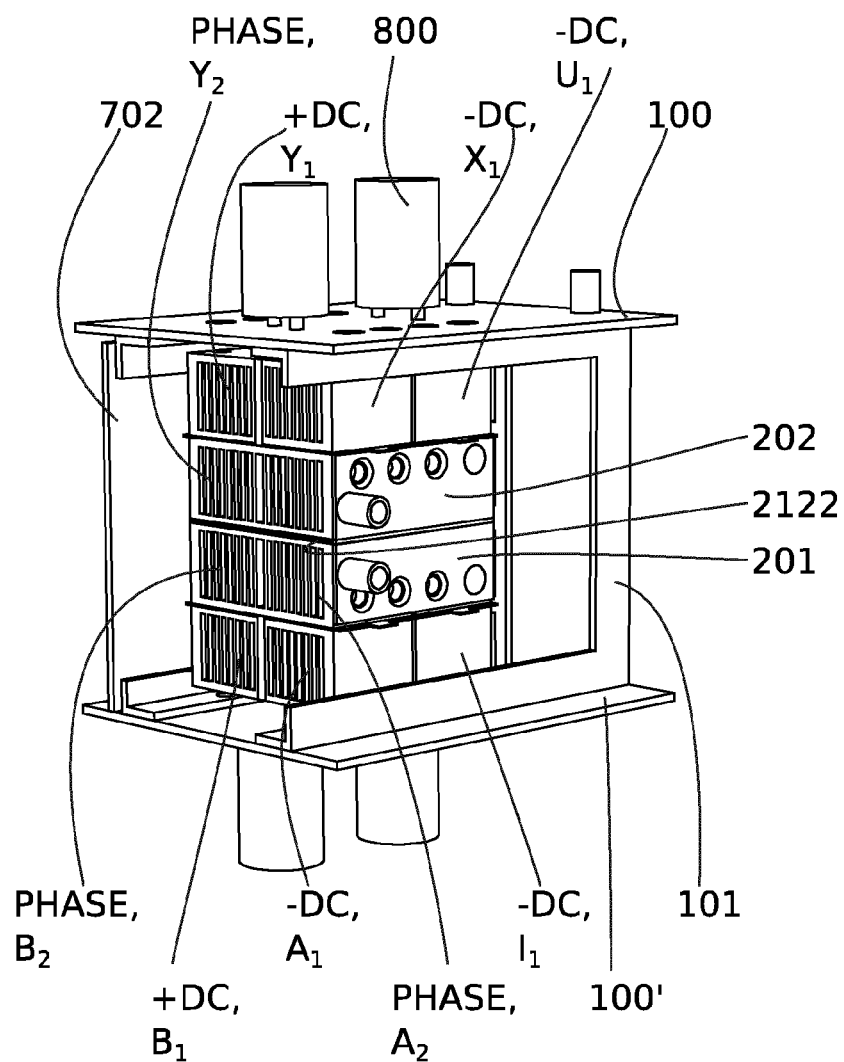
FIG. 28 schematically illustrates a single-phase inverter, according to another embodiment of the present invention.

FIGS. 27 and 28 illustrate two embodiments of such a single-phase inverter.

In the embodiment illustrated in FIG. 27, the two inverter arms are formed by two cell blocks aligned along x. The first block comprises the two cells centrally connected by their phase heatsinks A2, B2, X2, Y2. A phase plate 201, configured to be polarised according to a first phase potential, connects the heatsinks A2, B2, X2, Y2 together. The second block comprises the two cells centrally connected by their phase heatsinks V2, U2, I2, J2. A phase plate 202, configured to be polarised according to a second phase potential, connects the heatsinks V2, U2, I2, J2 together. An insulator 2122 allows insulating the phase heatsinks which are not at the same potential. This insulator herein extends according to a plane yz.

In the embodiment illustrated in FIG. 28, the two inverter arms are formed by two cell blocks superimposed along z. The first block comprises the two cells connected axially by their phase heatsinks A2, B2, I2, J2. A phase plate 201, configured to be polarised according to a first phase potential, connects the heatsinks A2, B2, I2, J2 together. The second block comprises the two cells connected axially by their phase heatsinks V2, U2, X2, Y2. A phase plate 202, configured to be polarised according to a second phase potential, connects the heatsinks V2, U2, X2, Y2 together. Like before, an insulator 2122 allows insulating the phase heatsinks which are not at the same potential. This insulator herein extends according to a plane xy. It is possible to easily add other elementary cells on each inverter arm by aligning them along x and connecting them axially with the cells already connected, and by extending the phase plates 201, 202 along x.

Figure 29:
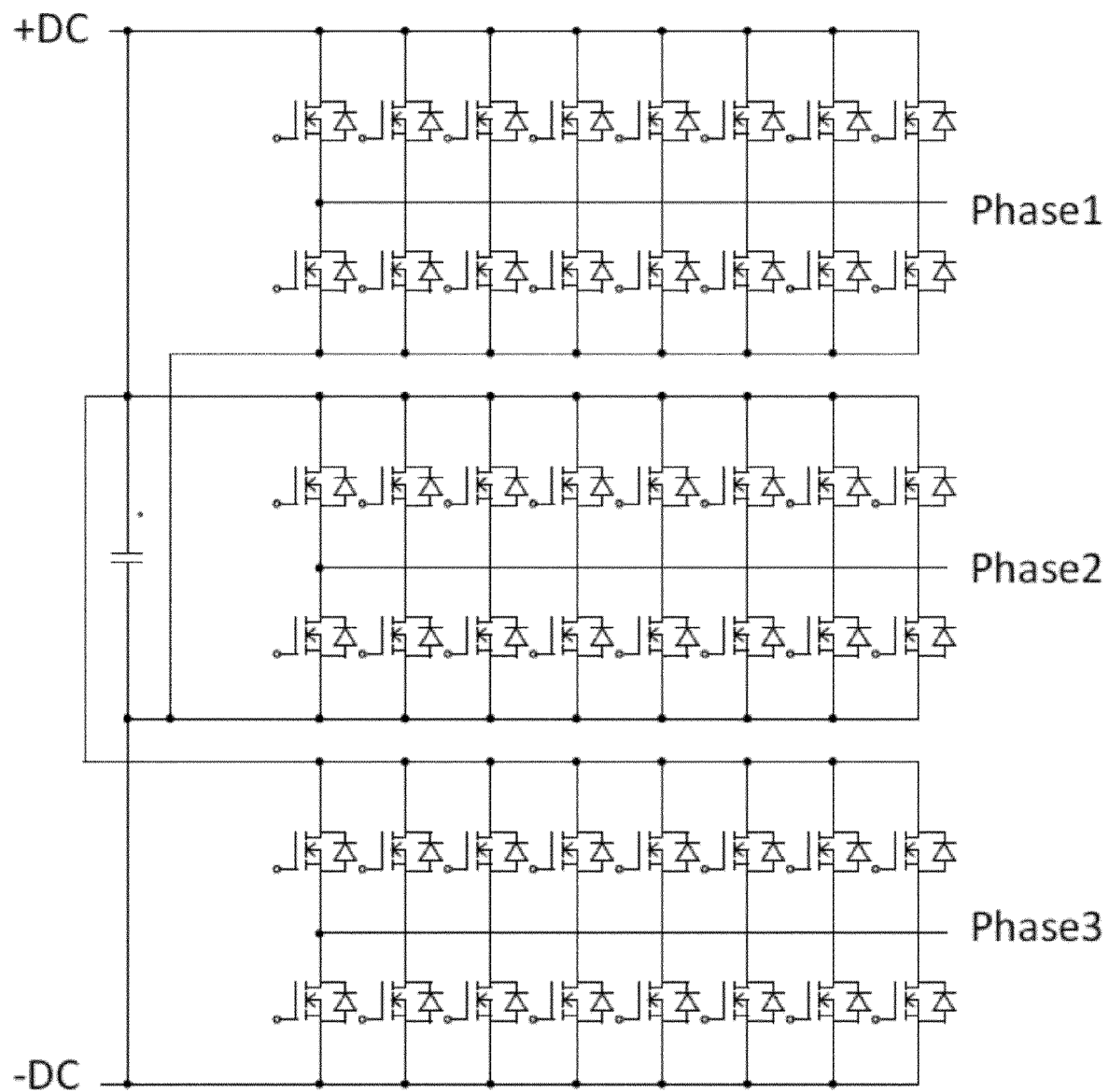
FIG. 29 represents the electrical diagram of a three-phase inverter comprising three times eight switching cells in parallel, according to an embodiment of the present invention.

FIG. 29 illustrates an electrical diagram of a two-level three-phase voltage inverter electronic system, in which each inverter arm comprises eight switching cells in parallel.

Figure 30A:
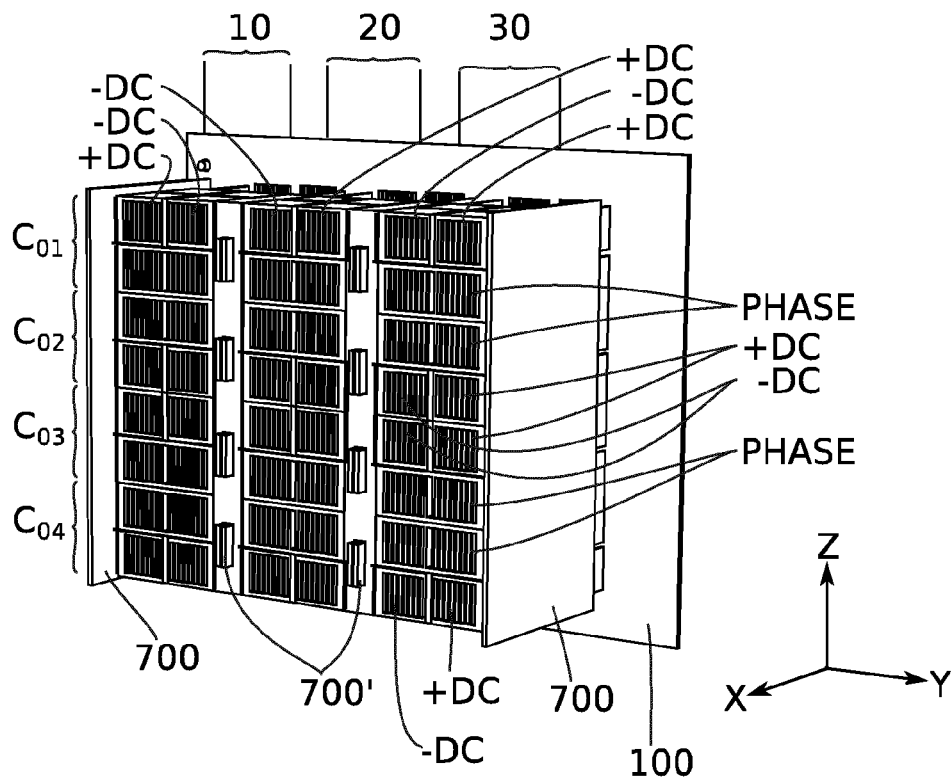
FIGS. 30A to 30C schematically illustrate a three-phase inverter, according to an embodiment of the present invention.

FIG. 30A illustrates an embodiment of a three-phase inverter derived from the electrical diagram of FIG. 29, in which each inverter arm comprises eight switching cells in parallel.

In this embodiment, the three inverter arms are formed by three cell blocks 10, 20, 30, said blocks being adjacent along y. Each block comprises two cell sub-blocks, said sub-blocks being aligned and axially connected together. Each sub-block comprises four centrally connected cells. For example, the first sub-block of the block 10 comprises the cells C01, C02, C03, C04. The cells C01, C02 are connected centrally by their phase heatsinks. The cells C02, C03 are centrally connected by their anode and cathode heatsinks. The cells C03, C04 are centrally connected by their phase heatsinks. The same type of connection may be made for the cells of the other sub-blocks of the blocks 10, 20, 30.

The phase heatsinks of the first block are configured to be polarised according to a first phase potential. The phase heatsinks of the second block are configured to be polarised according to a second phase potential. The phase heatsinks of the third block are configured to be polarised according to a third phase potential. The blocks 10, 20, 30 may be separated from each other by separation spaces. This allows isolating the phase heatsinks which are not at the same potential. The separation spaces may comprise control boards 700' and insulating foam, as previously illustrated in other embodiments.

The busbar 100 is herein configured to deliver the first, second, third phase potentials and the +DC and −DC potentials.

Figure 30B:
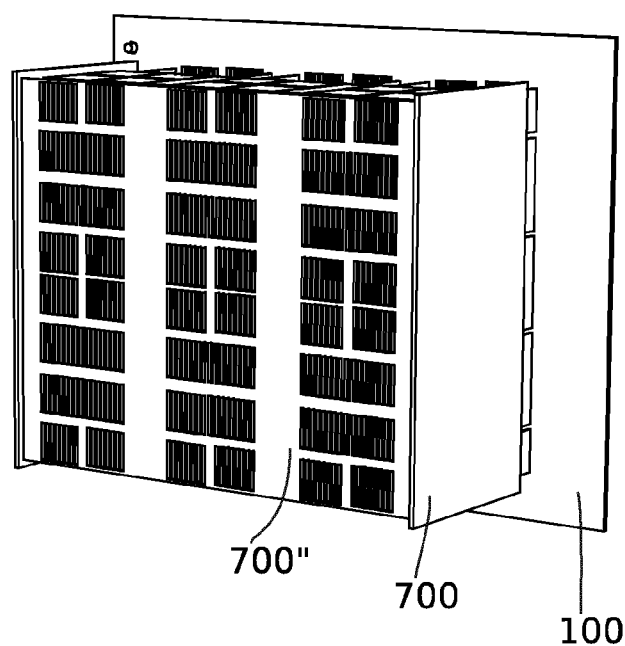
Figure 30C:
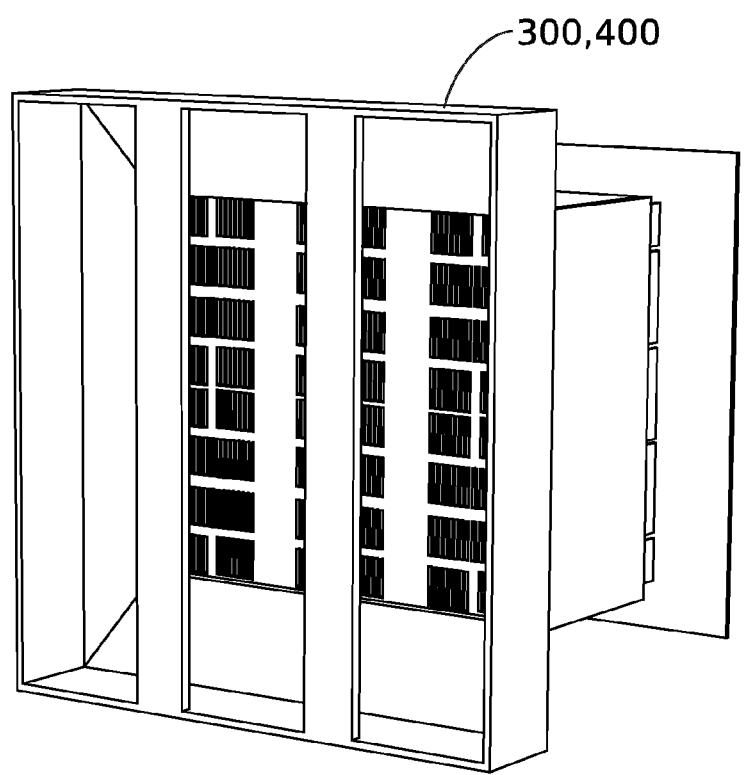

FIG. 30B illustrates an embodiment comprising a perforated motherboard 700", connecting the control boards 700, 700'. The boards 700 and 700" may serve as an EMC shield. FIG. 30C illustrates a package 300, 400 associated with the system illustrated in FIG. 30B.

Figure 31:
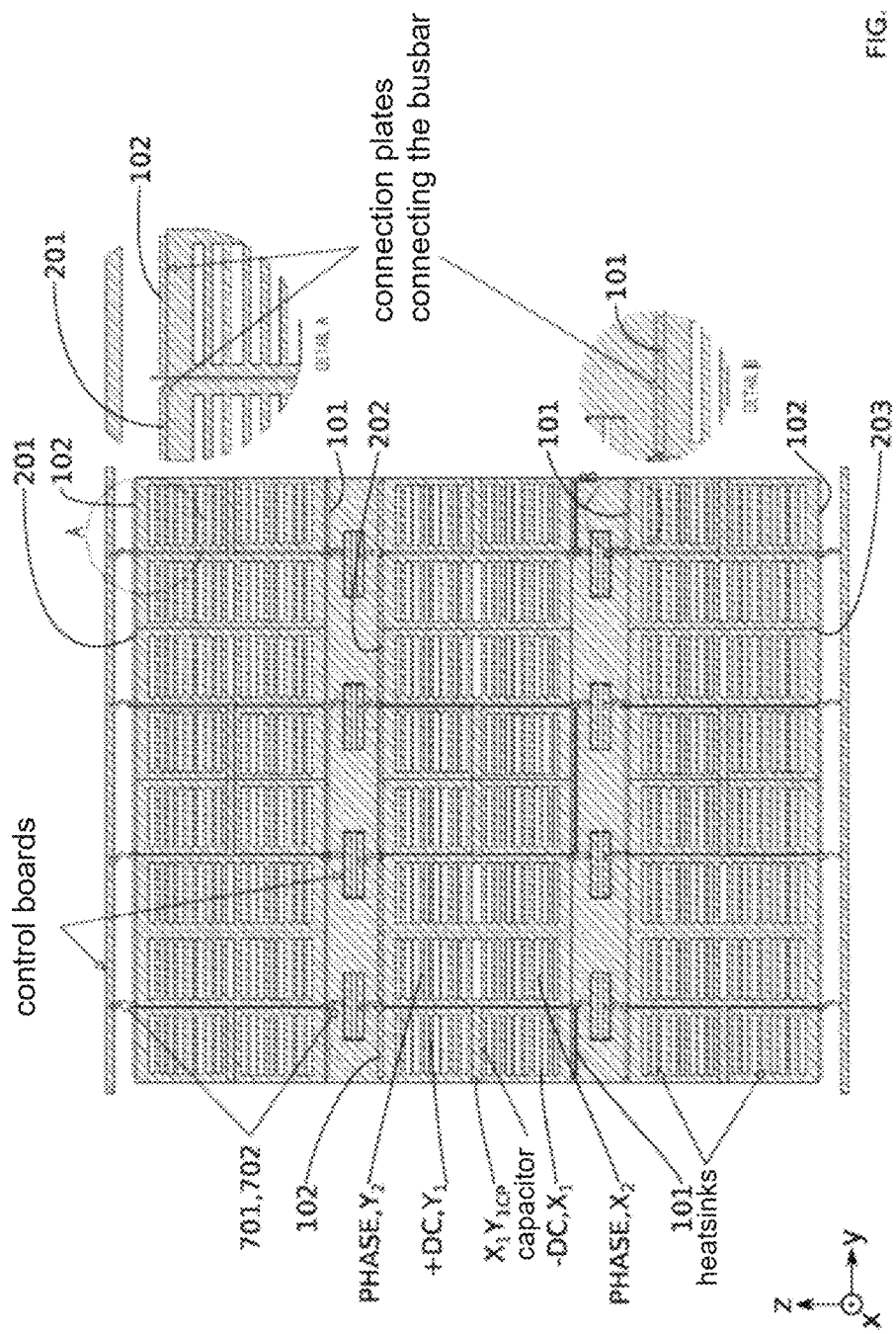
FIG. 31 illustrates in section the three-phase inverter illustrated in FIGS. 30A through 30C.

FIG. 31 shows a section of the three-phase inverter system of FIG. 30A, where one could see the connections 701, 702 between the control boards 700, 700' and the elementary cells. The connection plates 101, 102 connecting the busbar 100 to the anode and cathode heatsinks, and the connection plates 201, 202, 203 connecting the busbar 100 to the phase heatsinks respectively polarised according to the first, second, third phase potentials, are also shown in FIG. 31.

Other arrangements of elementary cells and/or of elementary modules may be considered to form other electronic systems.

Figure 32:
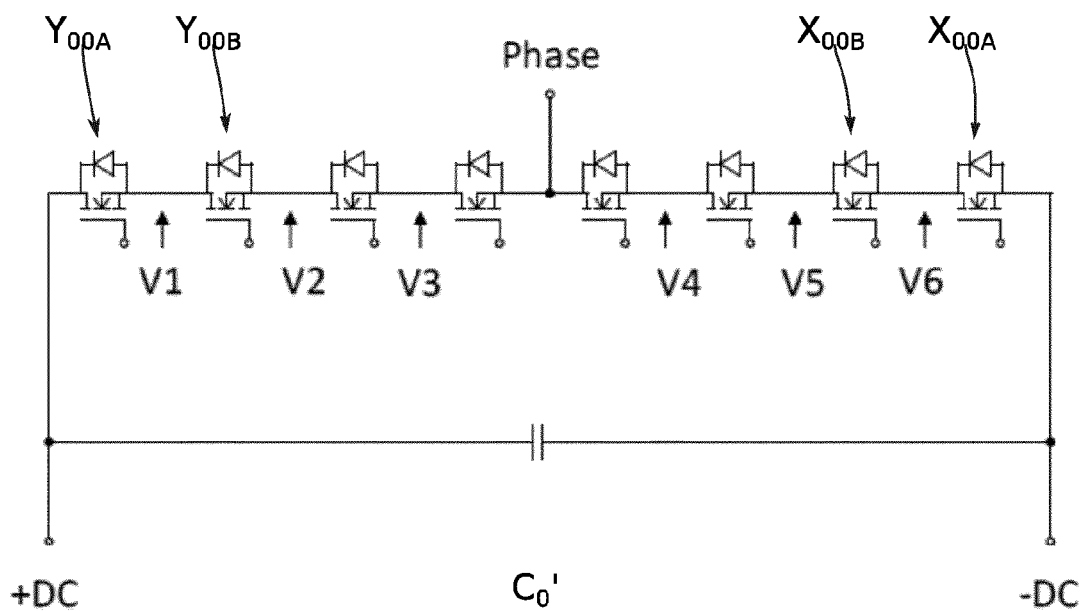
FIG. 32 represents an electrical diagram of a switching cell comprising two times four power components in series, according to an embodiment of the present invention.

FIG. 32 illustrates an electrical diagram of a switching cell in which each arm comprises four power components in series. The +DC, −DC, phase potentials and intermediate potentials denoted V1 to V6 are indicated in this FIG. 32, so as to clarify the internal connections to the elementary modules.

In this example of arrangement, the switching cell comprises two elementary modules formed as follows:

The first elementary module comprises, in the following order of connection:
- a cathode heatsink,
- a first component,
- an intermediate heatsink polarised according to V1,
- a second component,
- an intermediate heatsink polarised according to V2,
- a third component,
- an intermediate heatsink polarised according to V3,
- a fourth component,
- a phase heatsink.

The second elementary module comprises, in the following order of connection:
- an anode heatsink,
- a fifth component,
- an intermediate heatsink polarised according to V6,
- a sixth component,
- an intermediate heatsink polarised according to V5,
- a seventh component,
- an intermediate heatsink polarised according to V4,
- an eighth component,
- a phase heatsink.

The anode and cathode heatsinks are connected by a capacitive electrical connection, for example axial or lateral. The phase heatsinks are connected by a conductive electrical connection. The intermediate heatsinks are insulated from each other.

FIGS. 33 to 39 illustrate different practical embodiments of the electronic system defined in FIG. 32.

Figure 33:
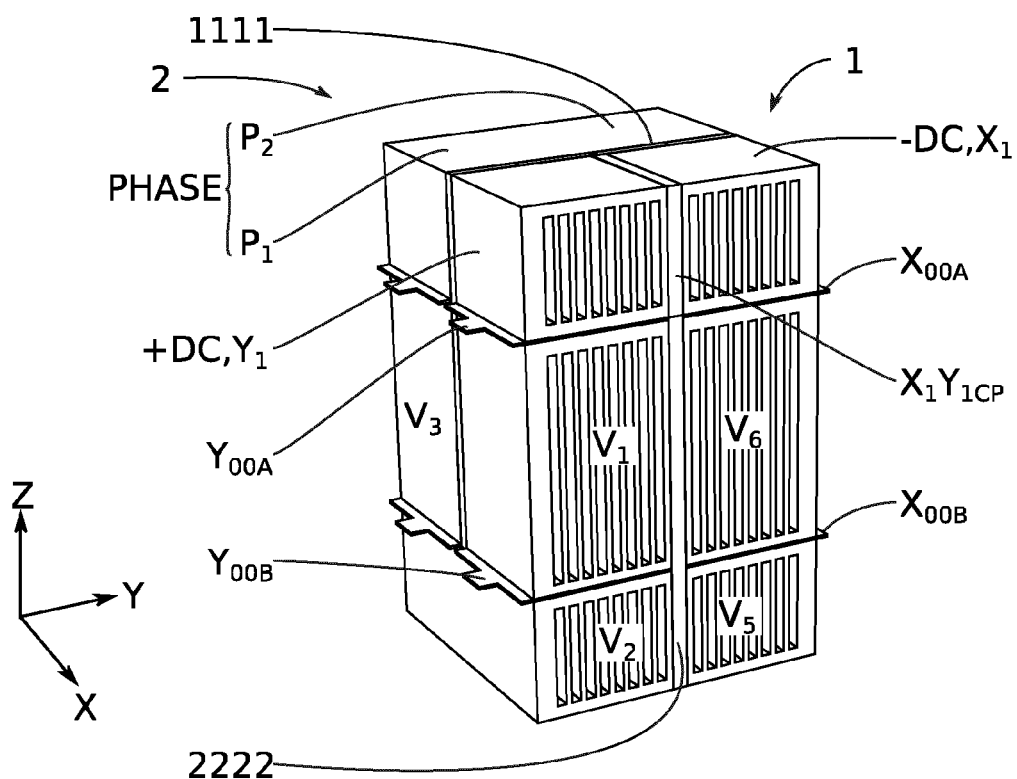
FIG. 33 schematically illustrates a switching cell corresponding to the electrical diagram of FIG. 32, according to an embodiment of the present invention.

According to an embodiment illustrated in FIG. 33, the elementary components are located according to two superimposed planes xy, and the phase heatsinks P1, P2 are aligned with the anode and cathode heatsinks X1, Y1 according to the flow direction x of the cooling fluid. The capacitive electrical connection X1Y1CP between the anode and cathode heatsinks is lateral, as described before. The phase heatsinks are insulated with respect to the anode and cathode heatsinks by an insulator 1111 letting the cooling fluid pass, for example an insulating foam.

Figure 34:
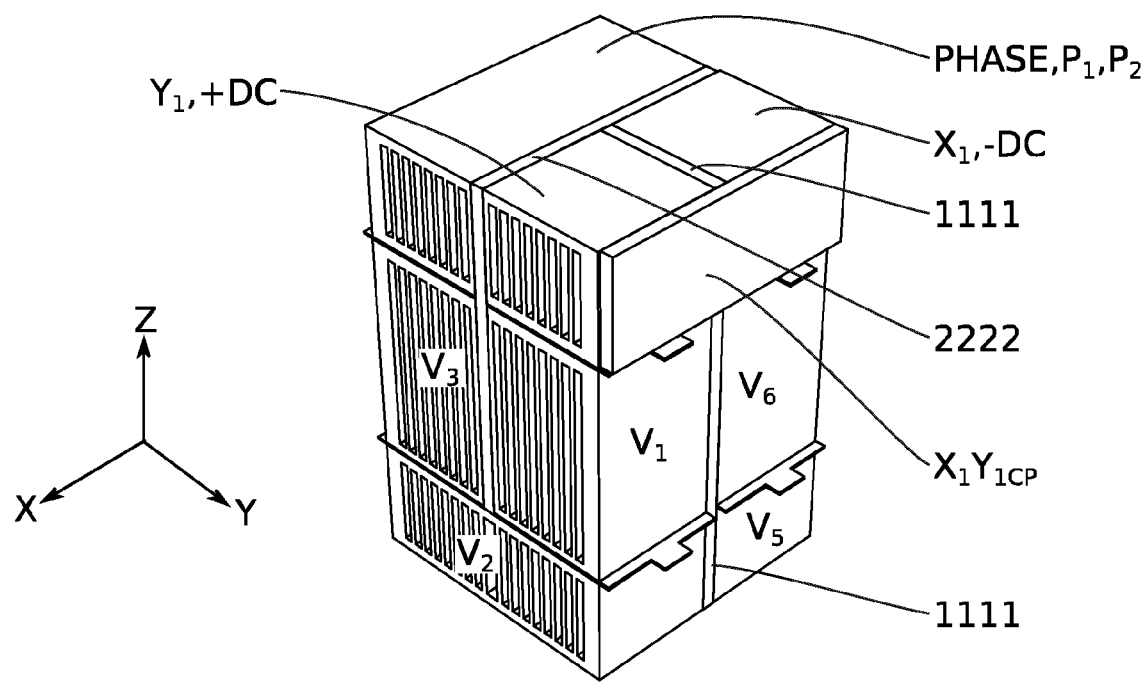
FIG. 34 schematically illustrates a switching cell corresponding to the electrical diagram of FIG. 32, according to another embodiment of the present invention.

According to an embodiment illustrated in FIG. 34, the elementary components are located according to two superimposed planes xy, and the phase heatsinks P1, P2 are adjacent to the anode and cathode heatsinks X1, Y1 according to the lateral direction y. The capacitive electrical connection X1Y1CP between the anode and cathode heatsinks is herein axial. It extends parallel to the flow direction x of the cooling fluid, in order to avoid a blockage of the flow. The phase heatsinks are insulated with respect to the anode and cathode heatsinks by an insulator 2222, which is not necessarily permeable to the cooling fluid.

In the two packages illustrated in FIGS. 33, 34, the adjacent heatsinks which are polarised according to different potentials should be electrically isolated from each other by electrical insulators 1111, 2222. Some insulators 1111 are configured to let the cooling fluid pass. The intermediate heatsinks polarised at the potentials V1, V3, V4 and V6 may be made with heatsinks higher than the others, along z, called XL heatsinks. This allows keeping the same exchange surface on either side of each elementary component. According to one possibility, each of these intermediate XL heatsinks may be replaced by two "standard" heatsinks identical to the others and assembled according to a central conductive electrical connection.

Figure 35:
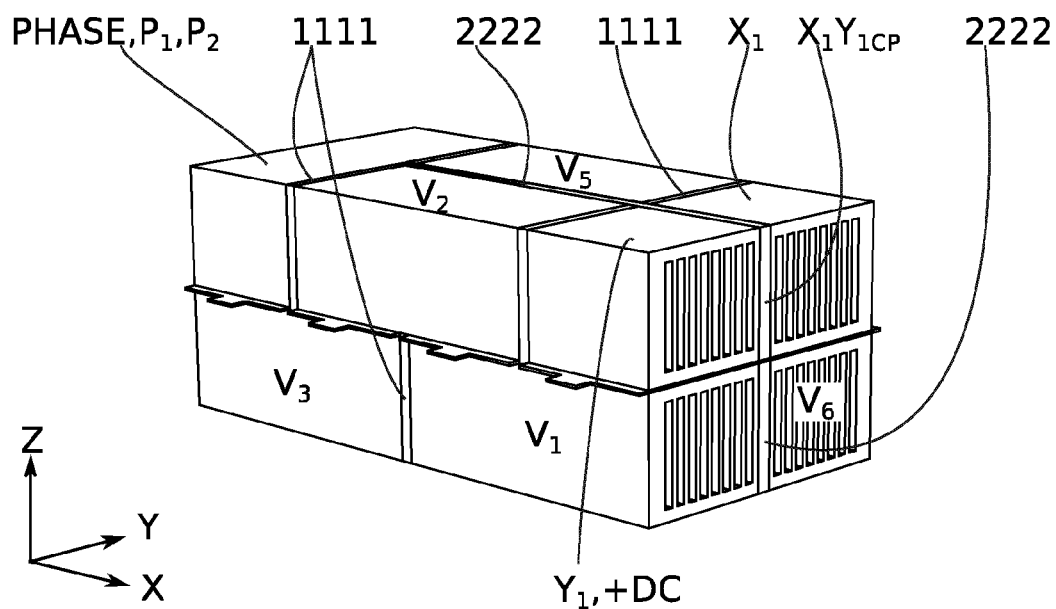
FIG. 35 schematically illustrates a switching cell corresponding to the electrical diagram of FIG. 32, according to another embodiment of the present invention.

According to an embodiment illustrated in FIG. 35, all elementary components are located in the same plane xy, and the phase heatsinks P1, P2 are aligned with the anode and cathode heatsinks X1, Y1 according to the flow direction x of the cooling fluid. The capacitive electrical connection X1Y1CP between the anode and cathode heatsinks is lateral, as described before. In this example, the intermediate heatsinks at the potentials V2, V3 are interposed between the phase heatsinks P1, P2 and the anode and cathode heatsinks X1, Y1 according to the direction x.

Figure 36:
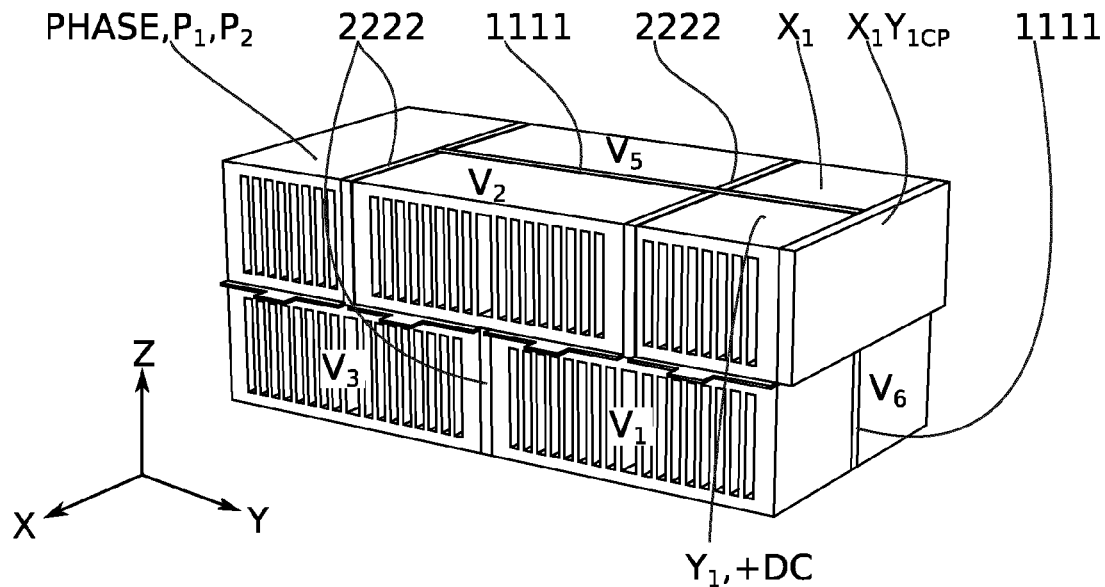
FIG. 36 schematically illustrates a switching cell corresponding to the electrical diagram of FIG. 32, according to another embodiment of the present invention.

According to an embodiment illustrated in FIG. 36, all elementary components are located in the same plane xy, and the phase heatsinks P1, P2 are adjacent to the intermediate heatsinks at the potentials V2, V3, according to the lateral direction y. The anode and cathode heatsinks X1, Y1 are also adjacent to the intermediate heatsinks at the potentials V2, V3, according to the lateral direction y. The capacitive electrical connection X1Y1CP between the anode and cathode heatsinks is axial. In this example, the intermediate heatsinks at the potentials V2, V3 are interposed between the phase heatsinks P1, P2 and the anode and cathode heatsinks X1, Y1 according to the direction y. The pressure drops of the flow along x are reduced in this embodiment.

Like before, electrical insulators 1111, 2222 respectively permeable or possibly non-permeable allow electrically insulating the adjacent heatsinks which are polarised according to different potentials.

Figure 37:
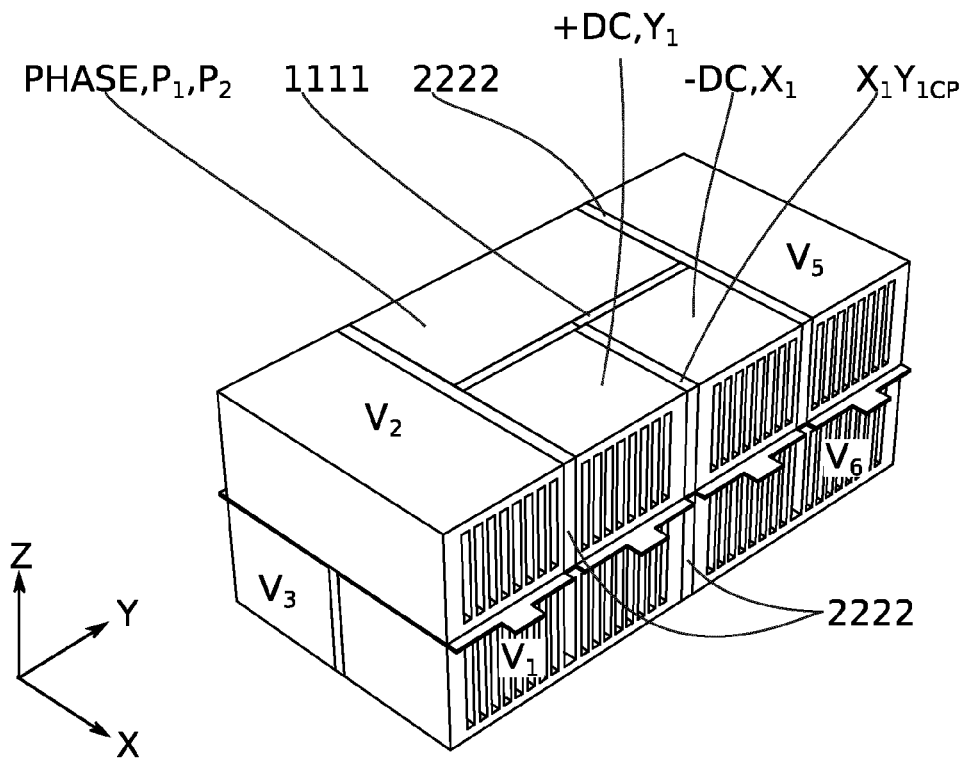
FIG. 37 schematically illustrates a switching cell corresponding to the electrical diagram of FIG. 32, according to another embodiment of the present invention.

According to an embodiment illustrated in FIG. 37, all elementary components are located in the same plane xy, and the phase heatsinks P1, P2 are aligned with the anode and cathode heatsinks X1, Y1 according to the flow direction x of the cooling fluid. The capacitive electrical connection X1Y1CP between the anode and cathode heatsinks is lateral, as described before. In this example, the phase heatsinks P1, P2 and the anode and cathode heatsinks X1, Y1 are adjacent. The pressure drops of the flow along x are reduced in this embodiment.

Figure 38:
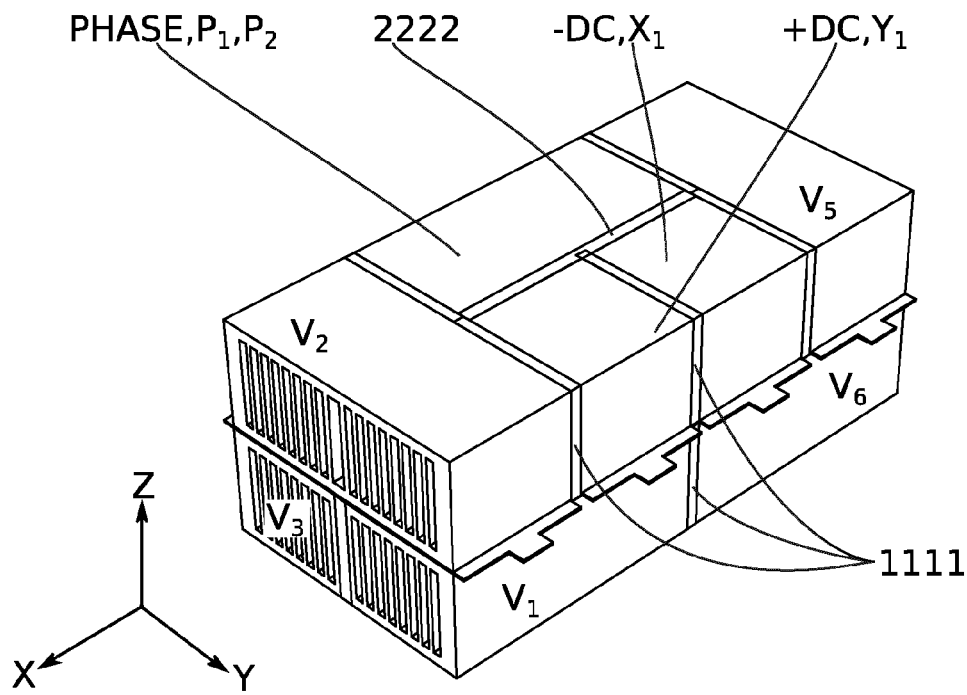
FIG. 38 schematically illustrates a switching cell corresponding to the electrical diagram of FIG. 32, according to another embodiment of the present invention.

According to an embodiment illustrated in FIG. 38, all elementary components are located in the same plane xy, and the phase heatsinks P1, P2 are adjacent to the anode and cathode heatsinks X1, Y1, according to the lateral direction y. The capacitive electrical connection X1Y1CP between the anode and cathode heatsinks is axial (not illustrated).

In the two packages illustrated in FIGS. 37, 38, this type of assembly allows modifying the parasitic capacitances and inductances within the switching cell compared to the previous examples. This allows modifying and adapting the behaviour of the electronic system during switching, depending on the needs.

Like before, electrical insulators 1111, 2222 respectively permeable or possibly non-permeable allow electrically insulating the adjacent heatsinks which are polarised according to different potentials.

Figure 39:
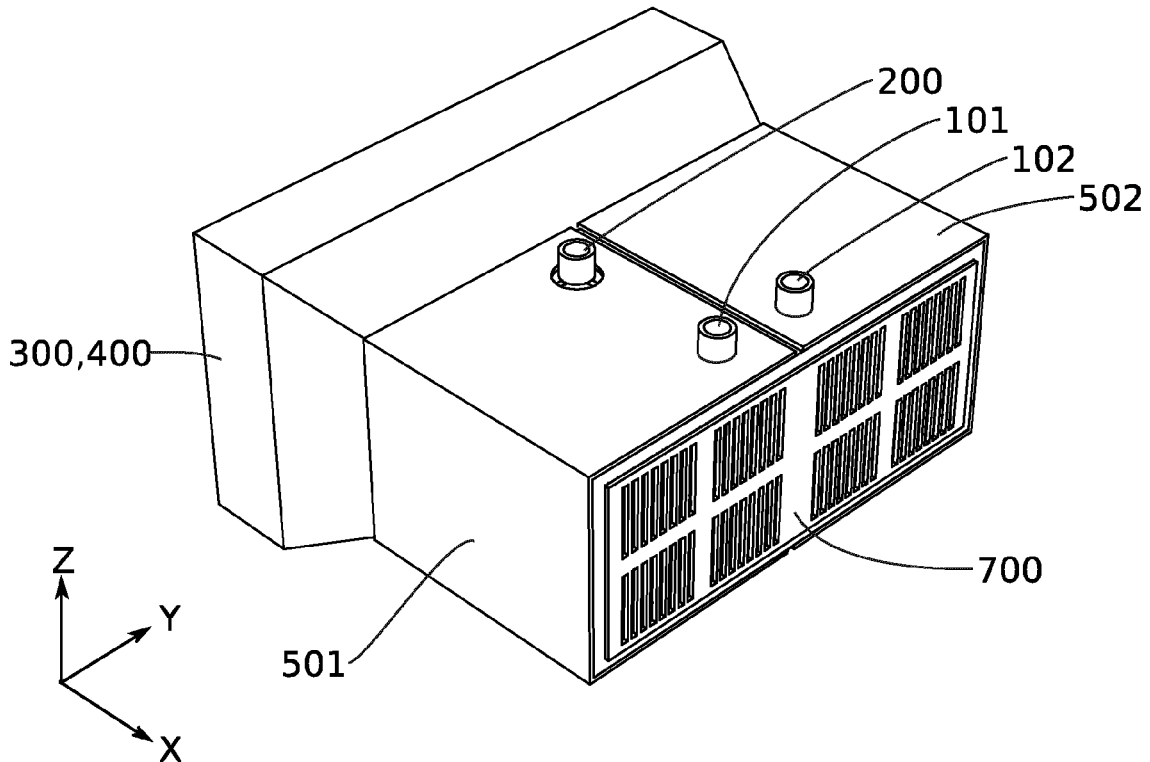
FIG. 39 schematically illustrates different elements (package, electromagnetic compatibility shields, control boards, etc.) assembled to the switching cell illustrated in FIG. 37, according to an embodiment of the present invention.

FIG. 39 illustrates the additional elements (package 300, 400, perforated control board 700, EMC shields 501, 502, external −DC 101, +DC 102, phase 200 connections) added to the electronic system illustrated.

The invention claimed is:

1. A power electronic system comprising a plurality of power components and a plurality of electrically-conductive heatsinks, each of said power components being disposed between two electrically-conductive heatsinks of the plurality of electrically-conductive heatsinks, at least one electrically-conductive heatsink being configured to be polarised according to a phase potential, called phase heatsink, at least one electrically-conductive heatsink being configured to be polarised according to a +DC potential, called cathode heatsink, and at least one electrically-conductive heatsink configured to be polarised according to a −DC potential, called anode heatsink, wherein the system further comprises at least one external phase connection, and at least one external +DC connection, and at least one external −DC connection respectively connected to the phase heatsink, to the cathode heatsink and to the anode heatsink; wherein the power components and the electrically-conductive heatsinks are assembled so as to form elementary switching cells connected in parallel, each elementary switching cell comprising:
a first elementary power electronics module, called first elementary module,
a second elementary power electronics module, called second elementary module,
the first elementary module comprising:
an electrically-conductive heatsink configured to be polarised according to a-DC potential, called anode heatsink, and
an electrically-conductive heatsink configured to be polarised according to a phase potential, called first phase heatsink,
a first power component disposed between the anode heatsink and the first phase heatsink,
the second elementary module comprising:
an electrically-conductive heatsink configured to be polarised according to a +DC potential, called cathode heatsink,
an electrically-conductive heatsink configured to be polarised according to the phase potential, called second phase heatsink,
a second power component disposed between the cathode heatsink and the second phase heatsink,
said first and second elementary modules being adjacent according to a lateral connection direction and connected together by a conductive lateral electrical connection between the first and second phase heatsinks, and by a capacitive lateral electrical connection between the anode and cathode heatsinks.

2. The system according to claim 1, wherein the anode and cathode heatsinks and the phase heatsinks of the elementary switching cells are configured to let a cooling fluid pass according to an axial direction normal to the lateral connection direction.

3. The system according to claim 2, wherein the elementary switching cells are assembled one behind the other according to the axial direction, so that the anode heatsinks of said cells are aligned one behind the other according to the axial direction, and that the cathode heatsinks of said cells are aligned one behind the other according to the axial direction, and that the first phase heatsinks of said cells are aligned one behind the other according to the axial direction, and that the second phase heatsinks of said cells are aligned one behind the other according to the axial direction.

4. The system according to claim 3, wherein the external phase connection is made on a first side of the cells formed by the first and second phase heatsinks, and the external +DC and −DC connections are made on a second side of the cells formed by the anode and cathode heatsinks, said second side being opposite to the first side.

5. The system according to claim 3, comprising at least a first block and a second block of elementary switching cells assembled one behind the other according to the axial direction, said at least first and second blocks being adjacent and connected according to a central connection direction so that the first and second phase heatsinks of the first block are connected to the first and second phase heatsinks of the second block.

6. The system according to claim 5, wherein the external +DC and −DC connections respectively comprise +DC and −DC connectors configured to respectively connect the cathode heatsinks of the second block with the cathode heatsinks of the first block, and the anode heatsinks of the second block with the anode heatsinks of the first block.

7. The system according to claim 3, comprising at least a first block and a second block of elementary switching cells assembled one behind the other according to the axial direction, said at least first and second blocks being adjacent and separated according to the lateral connection direction by a separation space.

8. The system according to claim 7, wherein the separation space comprises at least one control board configured to control the power components of the elementary switching cells of each of the first and second blocks, and a draught-proofing configured to block a passage of the cooling fluid.

9. The system according to claim 7, wherein the cathode heatsinks of the first and second blocks border the separation space or wherein the anode heatsinks of the first and second blocks border the separation space.

10. The system according to claim 7, wherein the cathode and anode heatsinks of the first and second blocks border the separation space and wherein the first and second phase heatsinks of the first block are located on a side of the cells of the first block opposite to the separation space and wherein the first and second phase heatsinks of the second block are located on a side of the cells of the second block opposite to the separation space.

11. The system according to claim 10, wherein the separation space comprises the external +DC and −DC connections and wherein the external phase connection comprises a phase connector configured to connect the first and second phase heatsinks of the second block with the first and second phase heatsinks of the first block.

12. The system according to claim 7 wherein the elementary switching cells of each of the first and second blocks are assembled one behind the other according to the axial direction, so that the anode heatsink of a given cell is aligned with one amongst the first and second phase heatsinks of an immediately adjacent cell according to the axial direction, and that the cathode heatsink of said given cell is aligned with the other one amongst the first and second phase heatsinks of the immediately adjacent cell according to the axial direction, said anode and cathode heatsinks being electrically insulated with respect to said first and second phase heatsinks.

13. The system according to claim 2, wherein the elementary switching cells are assembled one behind the other according to the axial direction, so that an anode heatsink of a given cell is aligned with a cathode heatsink of an immediately adjacent cell according to the axial direction, and vice versa, and that the first phase heatsinks of said cells are aligned one behind the other according to the axial direction, and that the second phase heatsinks of said cells are aligned one behind the other according to the axial direction.

14. The system according to claim 2, wherein all elementary switching cells are assembled side-by-side according to the lateral connection direction and/or according to a central connection direction normal to the axial direction, so as to reduce pressure drops during a flow of the cooling fluid according to the axial direction.

15. The system according to claim 2, wherein the external +DC and −DC connections are connected to a busbar, and wherein the busbar is disposed transversely to the axial direction, the busbar being configured to let the cooling fluid pass.

16. The system according to claim 15, wherein the busbar is in the form of a perforated grid.

17. The system according to claim 2, further comprising at least one control board surrounding the elementary switching cells, so that said at least one control board forms a package configured to channel the cooling fluid according to the axial direction.

18. The system according to claim 2, wherein a first portion of the elementary switching cells has first and second phase heatsinks configured to be polarised according to a first phase potential and a second portion of the elementary switching cells has first and second phase heatsinks electrically insulated with respect to the first and second phase heatsinks of the first portion of the cells, and configured to be polarised according to a second phase potential different from the first phase potential, and wherein the at least one external phase connection comprises a first external phase connection connected to the polarised heatsinks according to the first phase potential, and a second external phase connection connected to the polarised heatsinks according to the second phase potential.

19. The system according to claim 18, wherein the elementary switching cells of the first portion are connected via their first and second phase heatsinks according to a central connection direction, and the elementary switching cells of the second portion are connected via their first and second phase heatsinks according to the central connection direction, so that the phase heatsinks of the cells of the first portion are aligned with the phase heatsinks of the cells of the second portion according to the axial direction.

20. The system according to claim 18, wherein the elementary switching cells of the first portion are connected via their first and second phase heatsinks according to the axial direction, and the elementary switching cells of the second portion are connected via their first and second phase heatsinks according to the axial direction, so that the phase heatsinks of the cells of the first portion are aligned with the phase heatsinks of the cells of the second portion according to a central connection direction.

21. The system according to claim 18, wherein a third portion of the elementary switching cells has first and second phase heatsinks configured to be polarised according to a third phase potential, and wherein the at least one external phase connection comprises a third external phase connection connected to the polarised heatsinks according to the third phase potential.

22. The system according to claim 21 wherein the elementary switching cells of the first portion are connected via their first and second phase heatsinks according to a central connection direction, and the elementary switching cells of the second portion are connected via their first and second phase heatsinks according to the central connection direction, and the elementary switching cells of the third portion are connected via their first and second phase heatsinks according to the central connection direction.

23. The system according to claim 1, further comprising a package configured to surround the plurality of electrically-conductive heatsinks so as to channel a passage of a cooling fluid in said electrically-conductive heatsinks.

24. The system according to claim 1, further comprising at least one electromagnetic compatibility shield configured to be polarised according to the +DC or −DC potential, at least partially surrounding the at least one phase heatsink.

25. The system according to claim 1, further comprising at least one control board configured to control the plurality of power components and at least partially surrounding the plurality of electrically-conductive heatsinks.

26. A power electronic system comprising a plurality of power components and a plurality of electrically-conductive heatsinks, each of said power components being disposed between two electrically-conductive heatsinks of the plurality of electrically-conductive heatsinks, at least one electrically-conductive heatsink being configured to be polarised according to a phase potential, called phase heatsink, at least one electrically-conductive heatsink being configured to be polarised according to a +DC potential, called cathode heatsink, and at least one electrically-conductive heatsink configured to be polarised according to a −DC potential, called anode heatsink, wherein the system further comprises at least one external phase connection, and at least one external +DC connection, and at least one external −DC connection respectively connected to the phase heatsink, to the cathode heatsink and to the anode heatsink; wherein the power components and the electrically-conductive heatsinks are assembled so as to form at least one switching cell comprising power components in series, said switching cell comprising:
  a first elementary power electronics module, called first elementary module,
  a second elementary power electronics module, called second elementary module,
  the first elementary module comprising:
  an electrically-conductive heatsink configured to be polarised according to a-DC potential, called anode heatsink, and
  at least one electrically-conductive heatsink configured to be polarised according to a first intermediate potential, called first intermediate heatsink,
  an electrically-conductive heatsink configured to be polarised according to a phase potential, called phase heatsink, and
  a first power component disposed between the anode heatsink and the first intermediate heatsink, and
  at least one other power component in series with the first power component disposed between the first intermediate heatsink and the phase heatsink,
  the second elementary module comprising:
  an electrically-conductive heatsink configured to be polarised according to a +DC potential, called cathode heatsink,
  at least one electrically-conductive heatsink configured to be polarised according to a second intermediate potential, called second intermediate heatsink,
  an electrically-conductive heatsink configured to be polarised according to a phase potential, called phase heatsink, and
  a second power component disposed between the cathode heatsink and the second intermediate heatsink, and
  at least one other power component in series with the second power component disposed between the second intermediate heatsink and the phase heatsink,
  said first and second elementary modules being connected together by a conductive electrical connection between the phase heatsinks, and by a capacitive electrical connection between the anode and cathode heatsinks.

27. The system according to claim 26, wherein said first and second elementary modules are adjacent and the first and second intermediate heatsinks are connected together by an insulating electrical connection.

28. The system according to 26, wherein the capacitive electrical connection is a capacitive lateral electrical connection interposed according to a lateral connection direction between the anode heatsink and the cathode heatsink.

29. The system according to claim 28, wherein the anode and cathode heatsinks are adjacent according to the axial direction, and the phase heatsinks are aligned with the anode and cathode heatsinks according to a lateral connection direction.

30. The system according to claim 26, wherein the capacitive electrical connection is a capacitive axial electrical connection extending parallel to an axial direction.

31. The system according to claim 26, wherein the anode and cathode heatsinks, the first and second intermediate heatsinks and the phase heatsinks are configured to allow a cooling fluid to pass according to an axial direction.

32. The system according to claim 31, wherein the anode and cathode heatsinks are adjacent according to a lateral connection direction, and the phase heatsinks are aligned with the anode and cathode heatsinks according to the axial direction.

* * * * *